US011676950B2

(12) United States Patent
Bharath et al.

(10) Patent No.: US 11,676,950 B2
(45) Date of Patent: Jun. 13, 2023

(54) VIA-IN-VIA STRUCTURE FOR HIGH DENSITY PACKAGE INTEGRATED INDUCTOR

(71) Applicant: INTEL CORPORATION, Santa Clara, CA (US)

(72) Inventors: Krishna Bharath, Chandler, AZ (US); Sriram Srinivasan, Chandler, AZ (US); Amruthavalli Alur, Chandler, AZ (US); Kaladhar Radhakrishnan, Chandler, AZ (US); Huong Do, Chandler, AZ (US); William Lambert, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 387 days.

(21) Appl. No.: 16/635,147

(22) PCT Filed: Sep. 28, 2017

(86) PCT No.: PCT/US2017/054098
§ 371 (c)(1),
(2) Date: Jan. 29, 2020

(87) PCT Pub. No.: WO2019/066868
PCT Pub. Date: Apr. 4, 2019

(65) Prior Publication Data
US 2021/0098436 A1    Apr. 1, 2021

(51) Int. Cl.
*H01L 23/498*  (2006.01)
*H01L 23/64*  (2006.01)
(Continued)

(52) U.S. Cl.
CPC ........ *H01L 25/16* (2013.01); *H01L 23/49827* (2013.01); *H01L 23/49866* (2013.01); *H01L 23/642* (2013.01); *H01L 23/645* (2013.01)

(58) Field of Classification Search
CPC .................. H01L 25/16; H01L 25/0657; H01L 23/49827; H01L 23/645
See application file for complete search history.

(56) References Cited

U.S. PATENT DOCUMENTS 9,893,701 B1 *   2/2018   Plasterer ............ H01L 23/49827
10,608,125 B1 *  3/2020   Zhou .................... H01L 23/5389
(Continued)

FOREIGN PATENT DOCUMENTS

JP     2014007339    1/2014
KR    20130038210    4/2013
(Continued)

OTHER PUBLICATIONS

International Preliminary Report on Patentability for PCT Application No. PCT/US17/54098, dated Apr. 9, 2020.
(Continued)

*Primary Examiner* — Omar F Mojaddedi
(74) *Attorney, Agent, or Firm* — Essential Patents Group, LLP

(57) ABSTRACT

An apparatus is provided which comprises: a plurality of plated through holes; a material with magnetic properties adjacent to the plurality of plated through holes; and one or more conductors orthogonal to a length of the plurality of plated through holes, the one or more conductors to couple one plated through hole of the plurality with another plated through hole of the plurality such that an inductor is formed.

23 Claims, 18 Drawing Sheets

(51) Int. Cl.
  *H01L 25/065* (2023.01)
  *H01L 25/16* (2023.01)

(56) References Cited

U.S. PATENT DOCUMENTS

| | | | |
|---|---|---|---|
| 2002/0172025 A1* | 11/2002 | Megahed | H01L 25/0655 |
| | | | 361/767 |
| 2012/0153495 A1* | 6/2012 | Mallik | H01L 23/49894 |
| | | | 257/774 |
| 2013/0057365 A1 | 3/2013 | Mizushima et al. | |
| 2013/0257525 A1* | 10/2013 | Kosonocky | H01L 23/49827 |
| | | | 327/540 |
| 2015/0137931 A1 | 5/2015 | Mano et al. | |
| 2015/0235753 A1 | 8/2015 | Chatani et al. | |
| 2016/0190113 A1 | 6/2016 | Sharan et al. | |
| 2017/0236790 A1 | 8/2017 | Chinnusamy et al. | |
| 2019/0088603 A1* | 3/2019 | Marimuthu | H01L 23/528 |

FOREIGN PATENT DOCUMENTS

| | | |
|---|---|---|
| KR | 1020150053900 | 5/2015 |
| KR | 1020170095130 | 8/2017 |

OTHER PUBLICATIONS

International Search Report and Written Opinion for International Patent Application No. PCT/US17/54098, dated Jun. 28, 2018.

\* cited by examiner

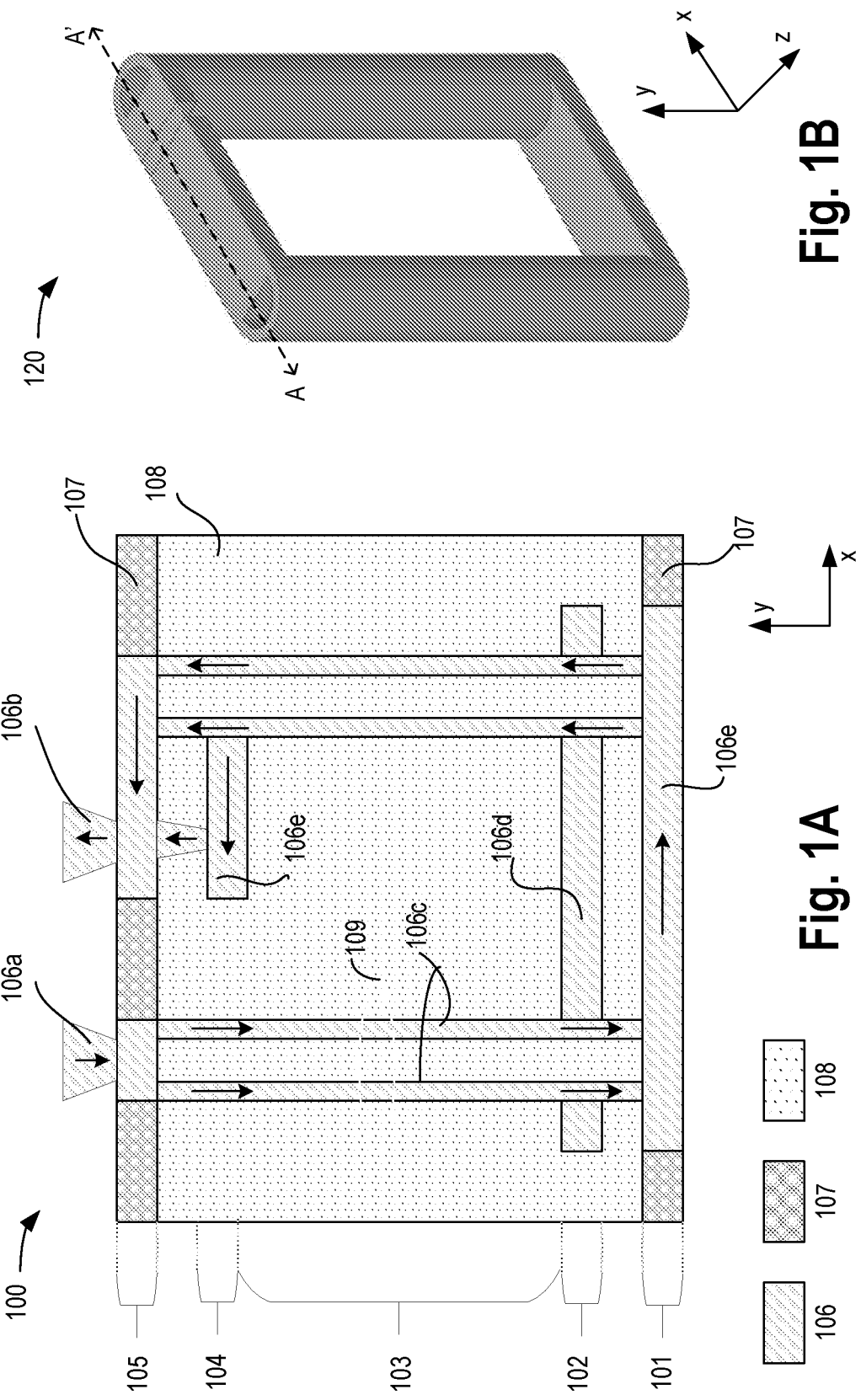

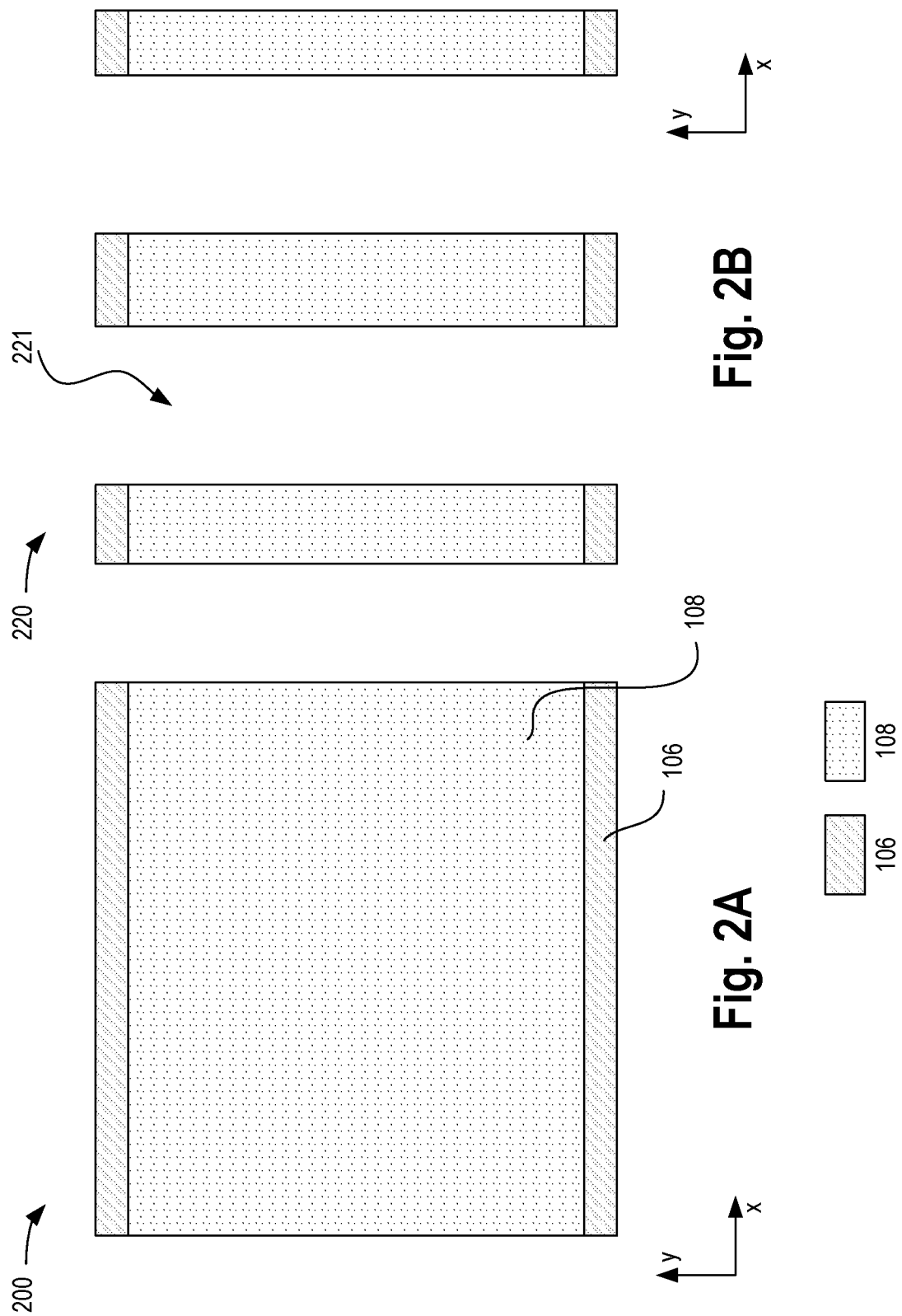

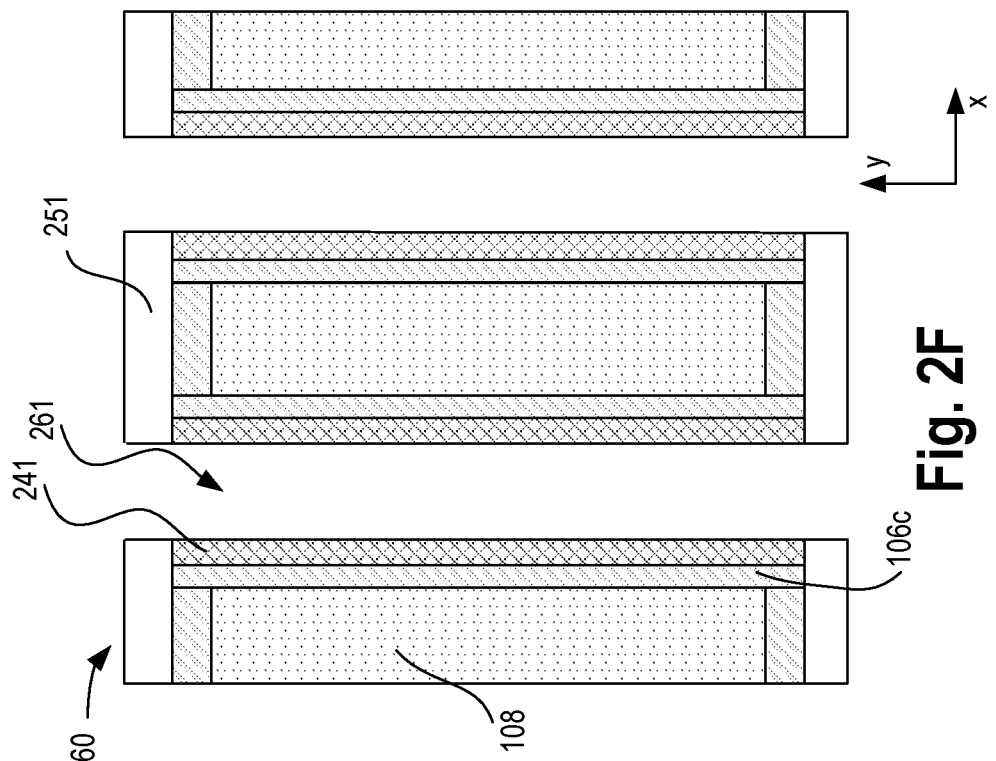
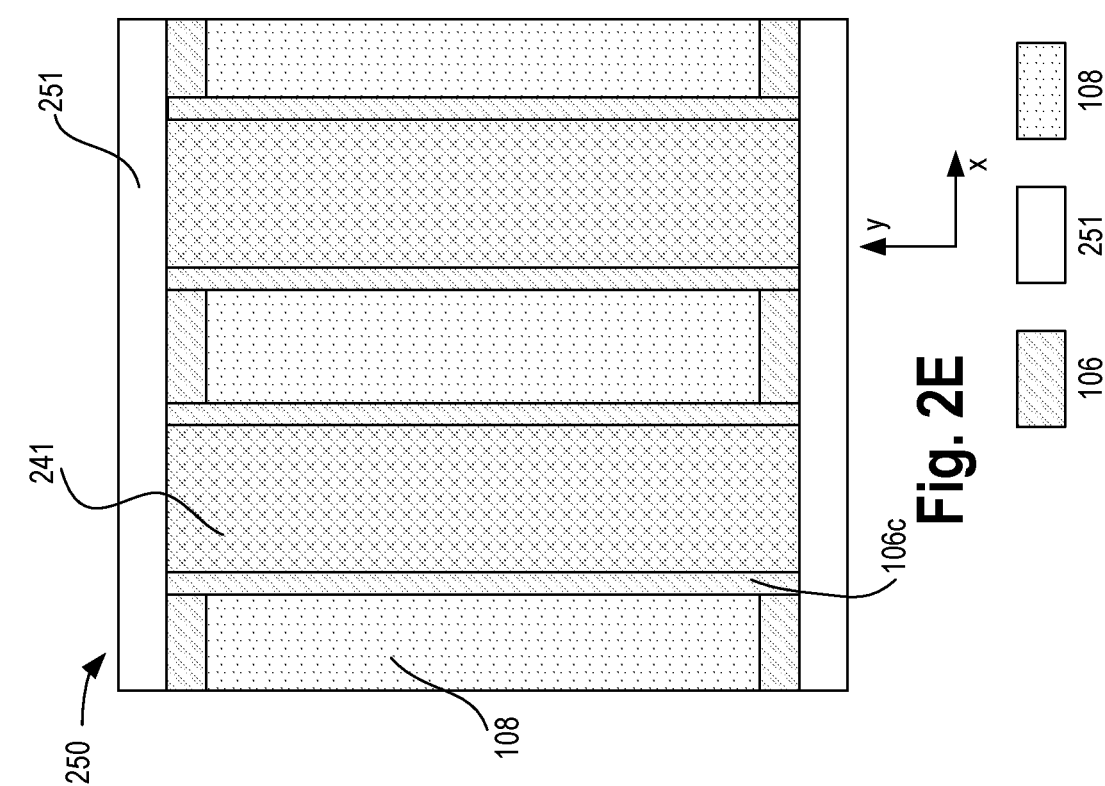

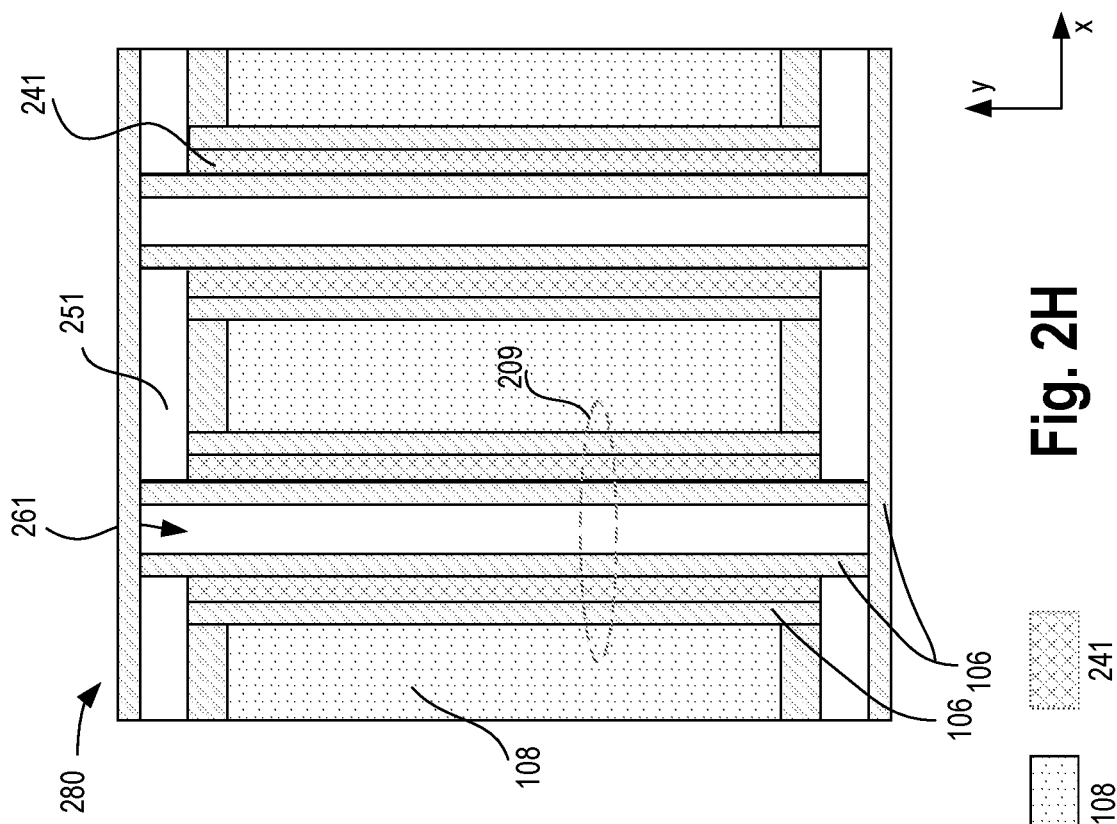
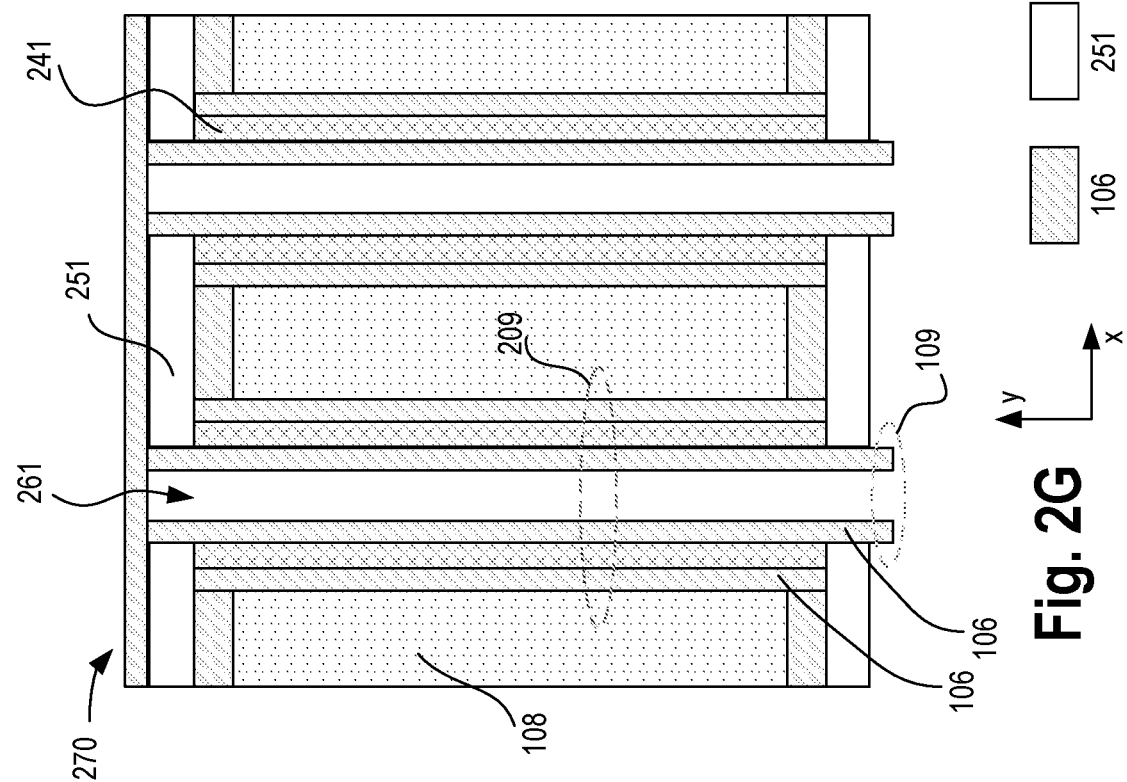
Fig. 2H
Fig. 2G

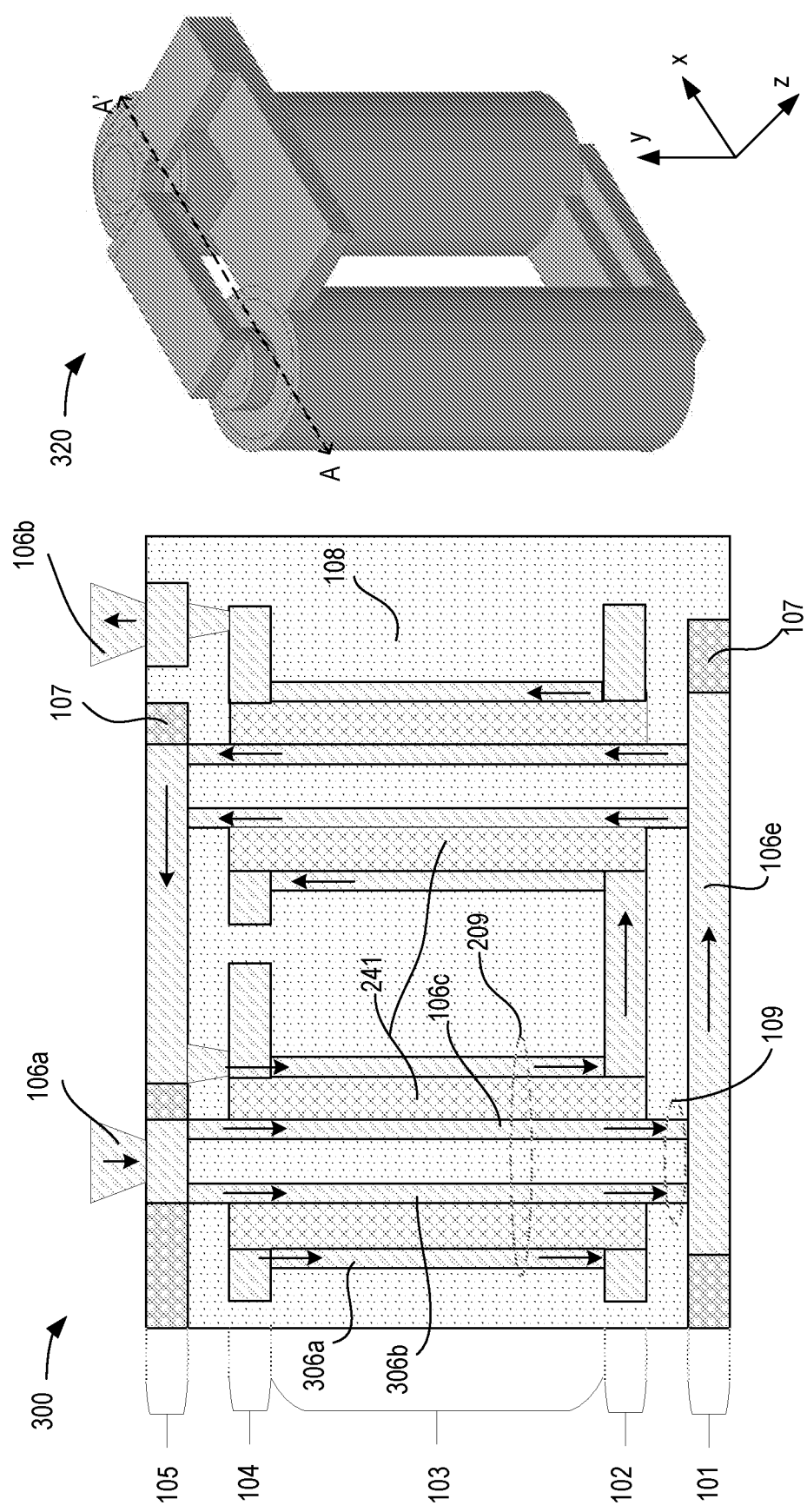

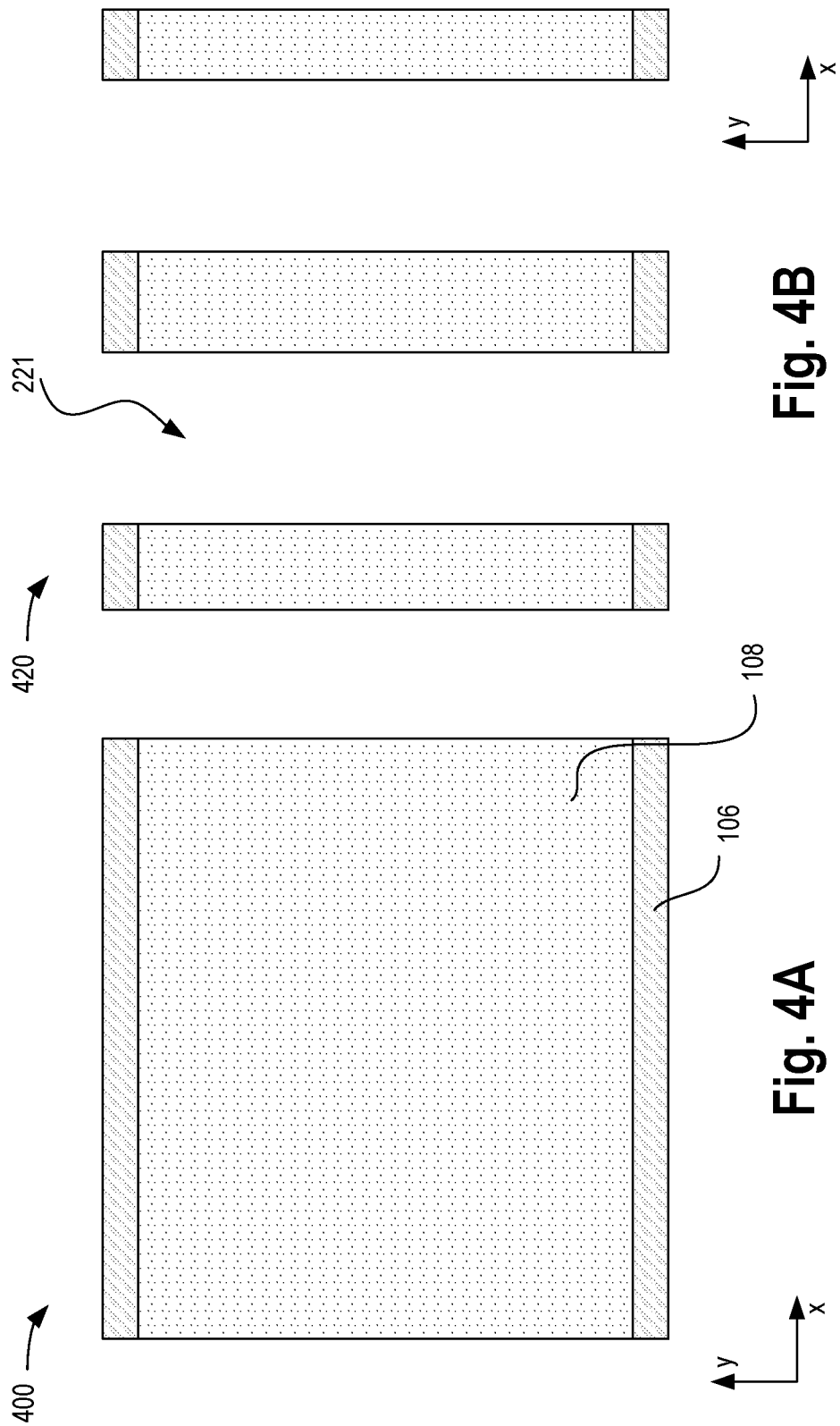

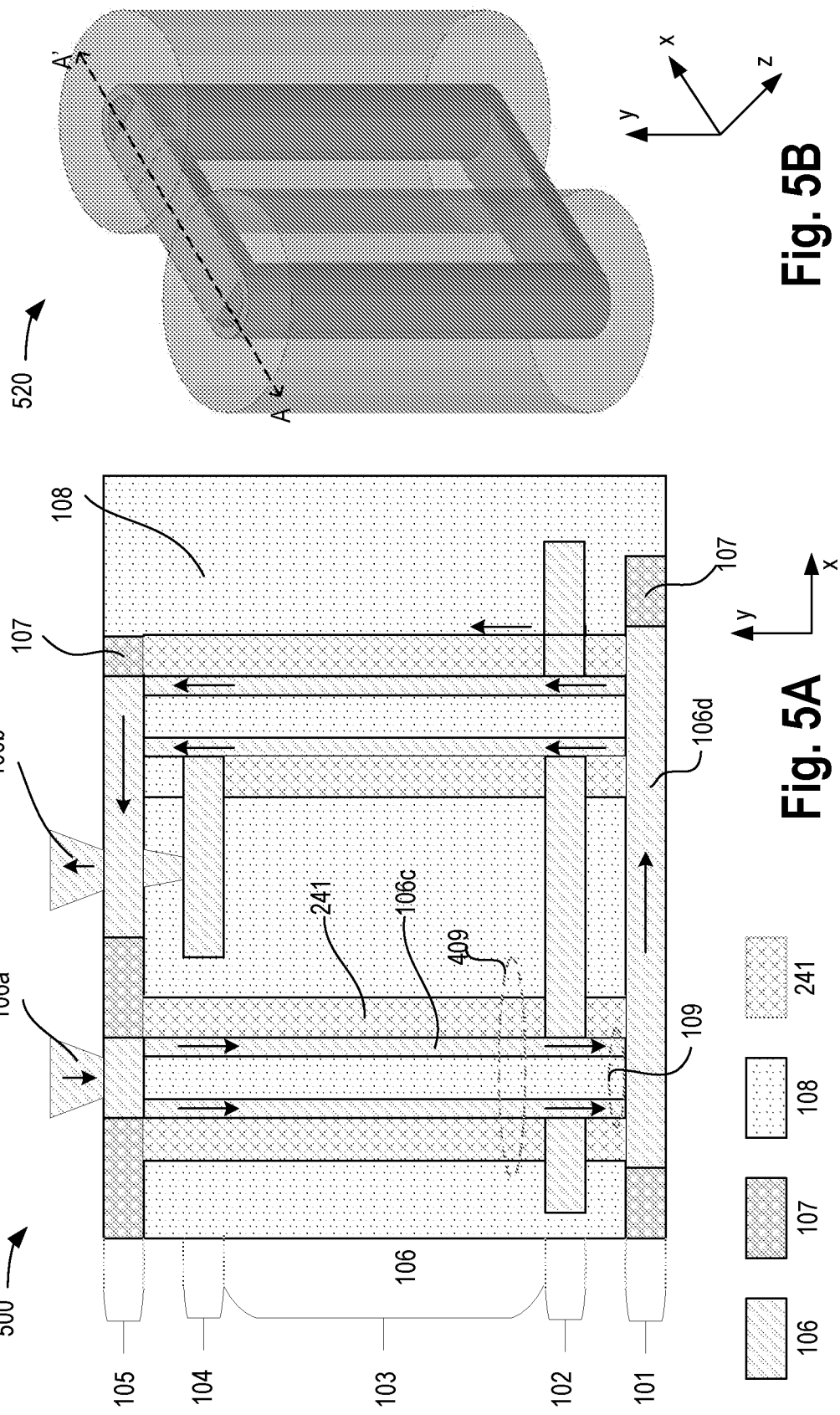

VIA-IN-VIA STRUCTURE FOR HIGH DENSITY PACKAGE INTEGRATED INDUCTOR

CLAIM OF PRIORITY

This Application is a National Stage Entry of, and claims priority to, PCT Application No. PCT/US17/54098, filed on 28 Sep. 2017 and titled "VIA-IN-VIA STRUCTURE FOR HIGH DENSITY PACKAGE INTEGRATED INDUCTOR," which is incorporated by reference in its entirety for all purposes.

BACKGROUND

Processors with integrated voltage regulation (IVR) schemes, such as FIVR (fully integrated voltage regulator), use package embedded air core inductors (ACIs). With Moore's law scaling, the footprint available for inductors reduces every generation, leading to a decline in the quality factor (Q factor) of these inductors, increased IVR losses, and reduced efficiency.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 1A-B illustrate a cross-section and a three-dimensional (3D) view, respectively, of an air core inductor (ACI) using plated-through-hole (PTH) vias.

FIGS. 2A-I illustrate a process flow for fabricating coaxial magnetic material based inductors, in accordance with some embodiments.

FIGS. 3A-B illustrate a cross-section and a 3D view, respectively, of a coaxial magnetic material based inductor using PTH vias fabricated using the process flow of FIGS. 2A-I, in accordance with some embodiments.

FIGS. 4A-G illustrate a process flow for fabricating a coaxial magnetic material based inductors with selective PTH wall plating, in accordance with some embodiments.

FIGS. 5A-B illustrate a cross-section and a 3D view, respectively, of coaxial magnetic material based inductor using PTH vias fabricated using the process flow of FIGS. 4A-G, in accordance with some embodiments.

DETAILED DESCRIPTION

Figure 2C:
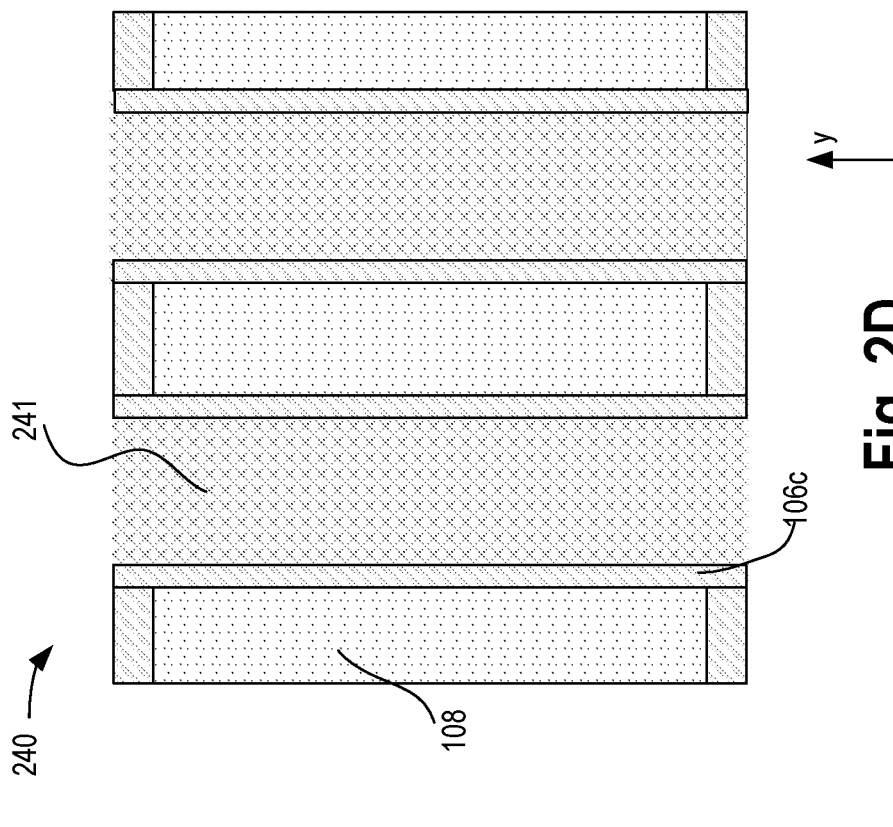
Figure 2D:
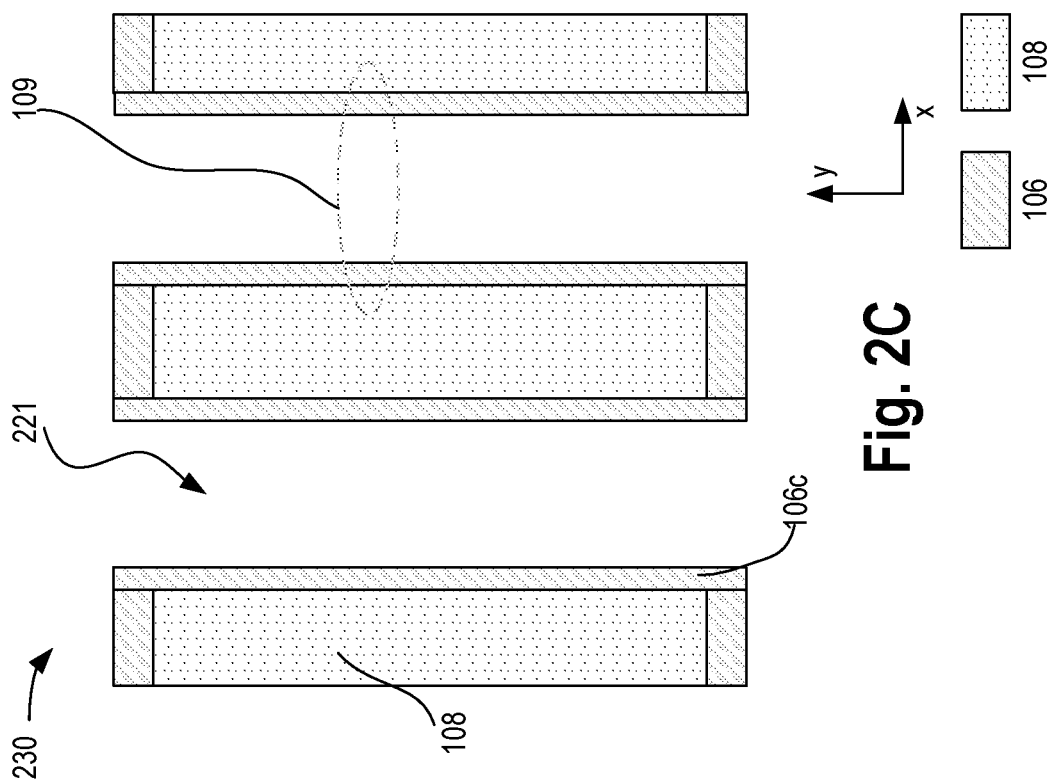
Figure 2I:
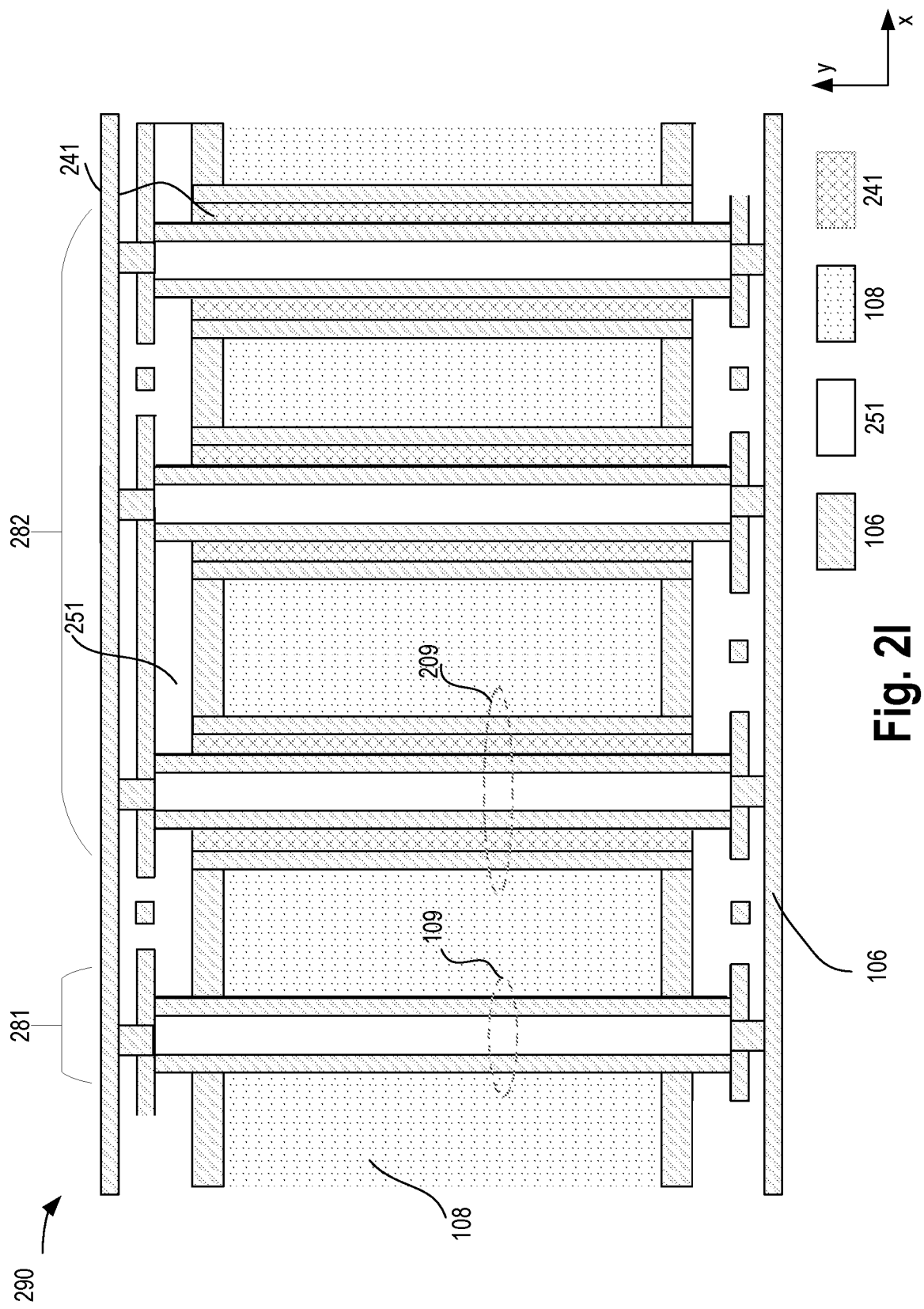
Figure 4D:
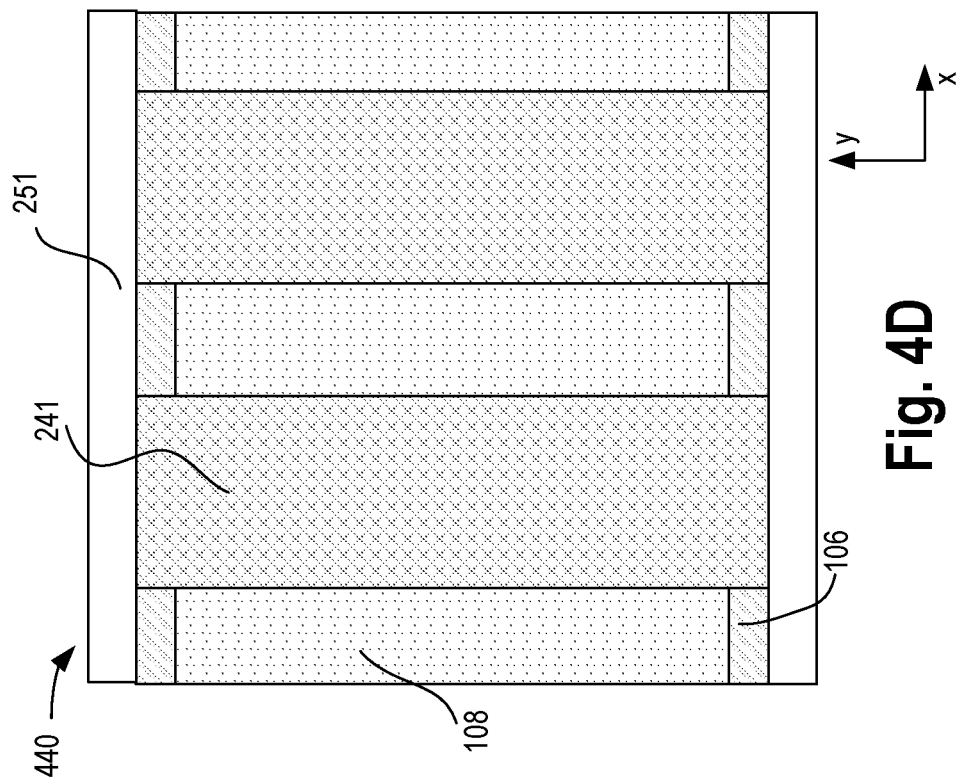
Figure 4C:
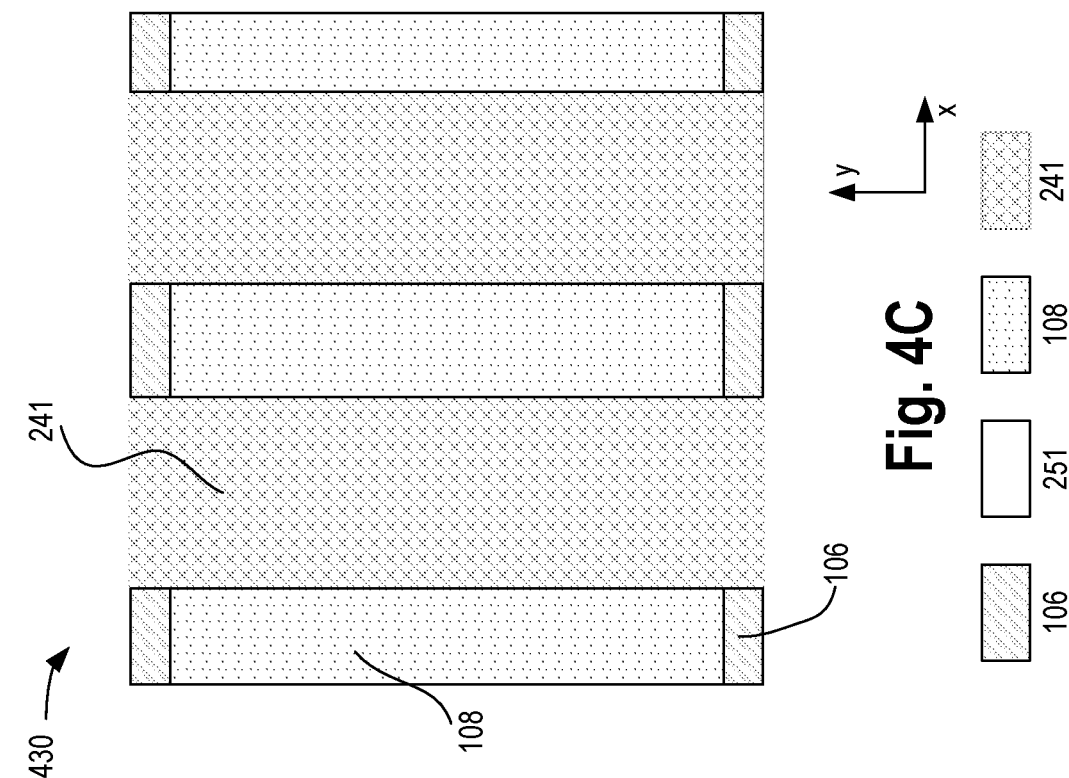
Figure 4F:
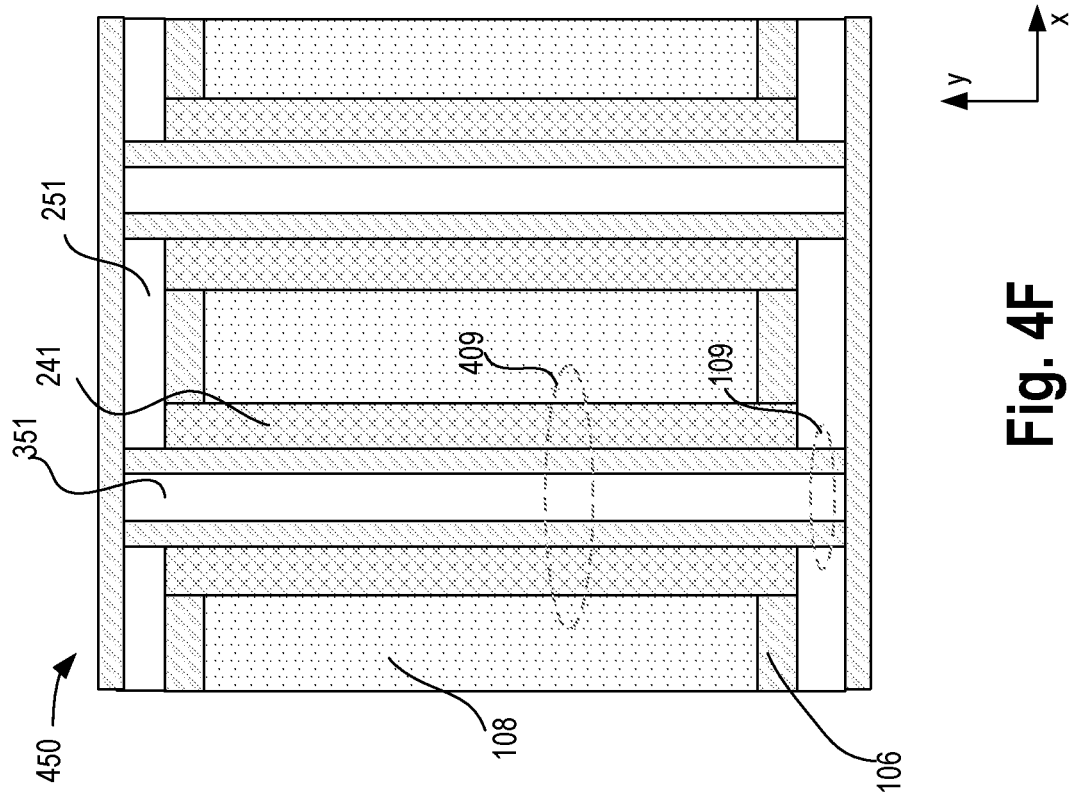
Figure 4E:
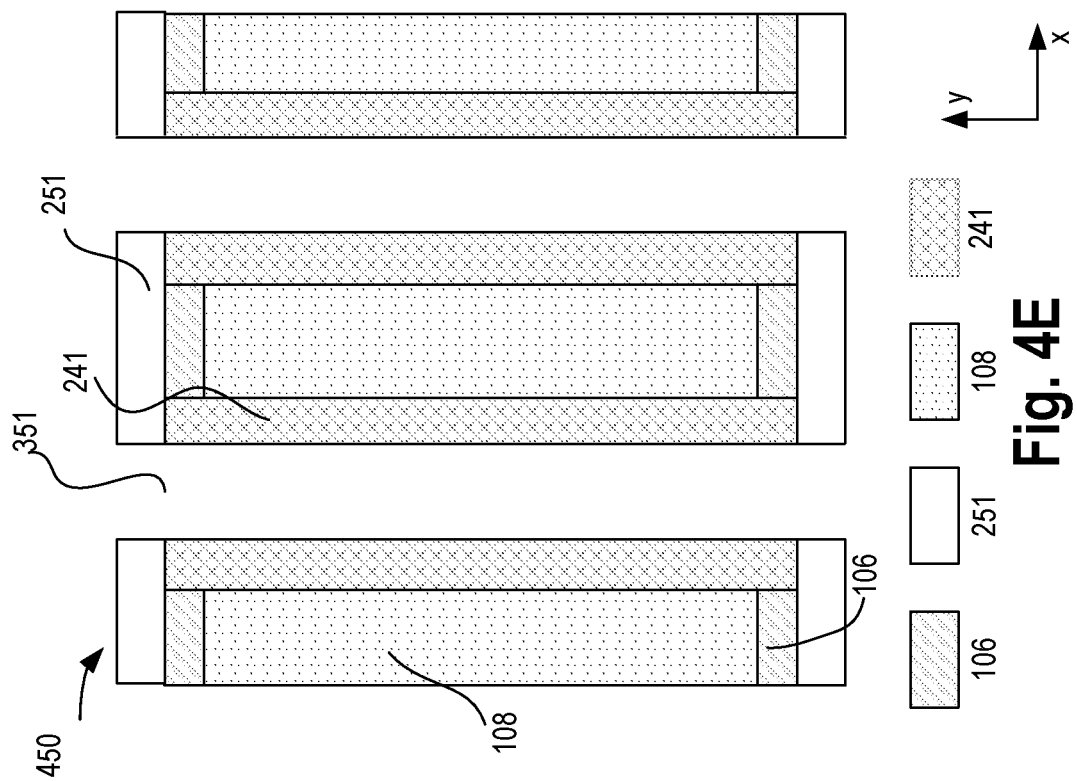
Figure 4G:
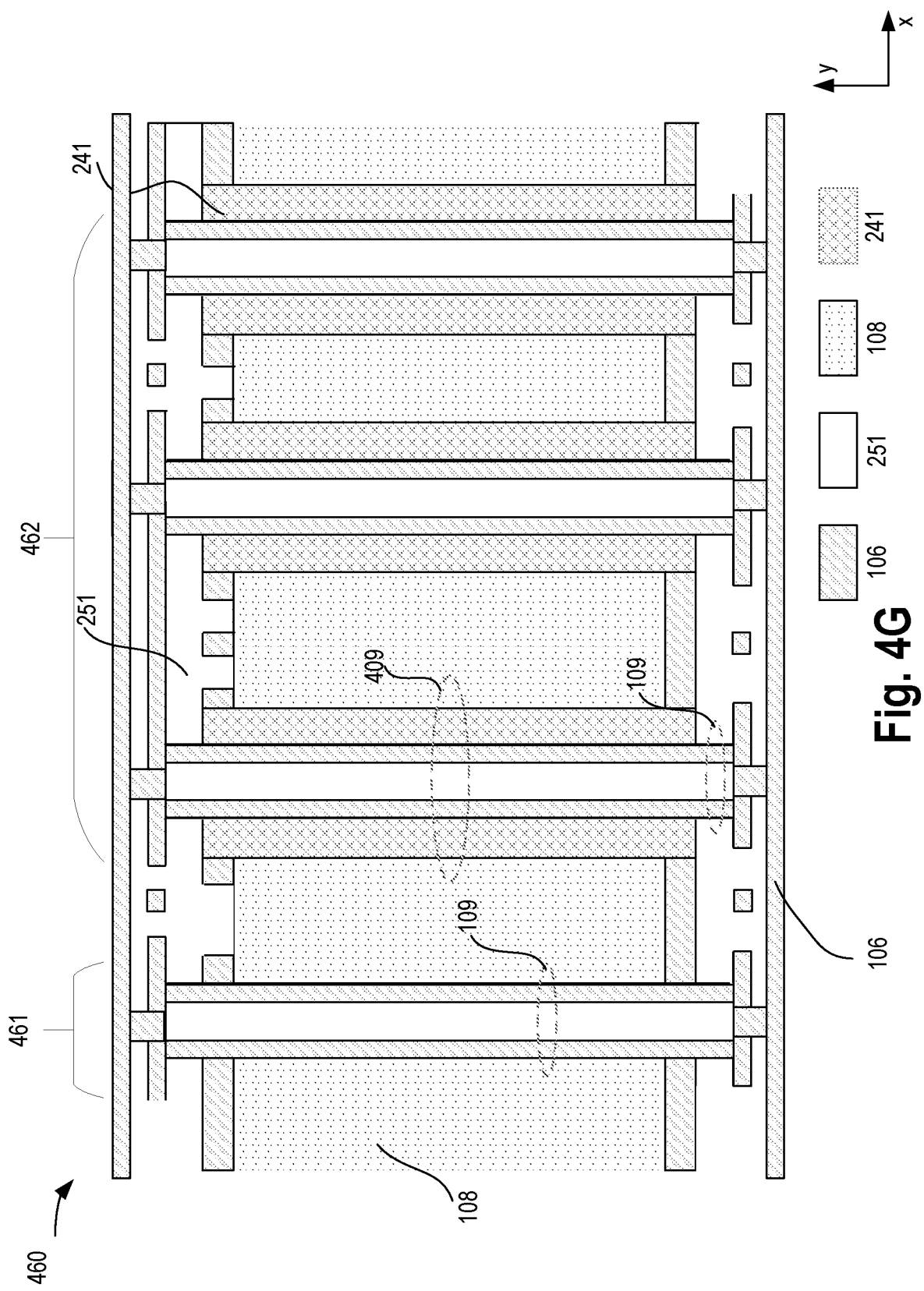

Products equipped with a turbo or similar high performance operating modes may routinely operate at a low current demand, but may exert a higher current demand upon entering the higher performance turbo mode. Unless the inductors included in the voltage regulator are able to support the current demand in the turbo mode, system performance must be reduced to a point where the inductors are able to safely handle the current flow. Further, inductors capable of handling high current flows associated with operation in the turbo mode may not be optimal for handling the relatively low currents associated with normal operation, increasing losses while in the normal operating mode, and in battery powered devices, compromising battery life.

Various embodiments describe a novel integration scheme which comprises magnetic materials in conjunction with via-in-via technology (also called a coaxial via) to increase inductance density and quality. In some embodiments, a coaxial plated-through-hole (PTH) is formed and filled with a high permeability dielectric to create an inductor with high inductance and quality factor (Q-factor), while decoupling the rest of the package from the magnetic material. In some embodiments, high permeability magnetic films are used as inter-layer dielectrics in the package. In some embodiments, the magnetic inductors are formed in a substrate of the package. In some embodiments, the magnetic inductors are formed in an interposer positioned between a lower most semiconductor die in a multi- or stacked-die semiconductor package and the substrate supporting the stacked-die semiconductor package.

In some embodiments, the switching elements of the voltage regulator (e.g., high-side and low-side switches or bridges) may include relatively large low-loss switching elements placed in series with the inductors in the interposer. In some embodiments, a control circuit disposed in the die stack monitors the current demand placed on the voltage regulators by each power consumer (e.g., by each rail coupled to a processor core). As the load (e.g., the load current demand) presented by the power consumer increases, the control circuit may conductively couple an inductor module (e.g., one or more magnetic inductors) while the high load condition exists. As the load decreases, the control circuit may decouple the one or more inductors from the inductor module, freeing the one or more inductors for use by another power consumer.

In some embodiments, a power delivery system is provided that includes a plurality of power delivery circuits (e.g., power gates driven by voltage regulators), each of the circuits to supply a load current to a respective one of a plurality of conductively coupled loads (e.g., processor core, cache, graphics unit, memory, etc.); a plurality of magnetic inductor modules, each of the plurality of inductor modules having an allowable current threshold, each of the plurality of inductor modules conductively coupled to a respective one of the power delivery circuits; and control circuitry to: receive information indicative of the load current supplied to at least one power delivery circuit; receive information indicative of the allowable current threshold of the at least one power delivery circuit; and determine whether the load current supplied by the at least one power delivery circuit exceeds the allowable current threshold for the inductor module conductively coupled to the at least one power delivery circuit.

In some embodiments, a non-transitory storage medium is provided that includes machine-readable instructions. The machine-readable instructions, when executed by a control circuitry, cause the control circuitry to: receive, from at least one power delivery circuit, at least one signal containing information indicative of a load current supplied to a load by at least one power delivery circuit, the at least one power delivery circuit including a conductively coupled magnetic inductor module; receive at least one signal containing information indicative of an allowable current threshold of the magnetic inductor module conductively coupled to the at least one power delivery circuit; and determine whether the load current supplied by the at least one power delivery circuit exceeds the allowable current threshold for the magnetic inductor module.

There are many technical effects of the various embodiments. For example, the embodiments provide higher integrated voltage regulator (IVR) efficiency that can be used for higher performance. For example, more inductors with higher inductance can be packed in a smaller area for use with a voltage regulator. In some embodiments, there is no impact to high speed IO (input-output) signaling using the via-in-via technology based magnetic inductors.

Currently, manufacturing processes for using high permeability films as interlayer dielectrics are not currently capable of localizing the magnetic material to the inductor, and will prevent the layers above and below it to be used for signaling, adding layer count. Various embodiments describe a process flow that uses high permeability material for forming inductors with minimum disruption to existing substrate manufacturing and assembly processes compared to the substrate embedding approach. Various embodiments reduce the parasitic capacitances/resistance to connect from the die to the discrete inductors on the land-side, resulting in a higher quality solution. Various embodiments apply well understood substrate manufacturing processes such as PTH drilling, and so it is more scalable as well. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front." "back," "top." "bottom." "over," "under." and the like in the description and in the claims, if any, are used for descriptive purposes and not necessarily for describing permanent relative positions.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

It is pointed out that those elements of a figure having the same reference numbers (or names) as the elements of any other figure can operate or function in any manner similar to that described, but are not limited to such.

FIGS. 1A-B illustrate a cross-section 100 and a three-dimensional (3D) view 120, respectively, of an air core inductor (ACI) using plate-through-hole (PTH) vias. With respect to ACI 120, the cross-section 100 is along the dashed-lines AA'.

In this example, a five-layer substrate is used to fabricate an ACI. The first layer 101 is a second backside of core (2BCO) layer, the second layer 102 is a first backside of core (1BCI) layer, the third layer 103 is the core layer, the fourth layer is the first front side of core (1FCI) layer, and the fifth layer 105 is the second front side of core (2FCO) layer. The general label for conductors or non-magnetic conducting material is 106, the general label for lamination layer is 107, and the general label for a dielectric or substrate is 108.

In various embodiments, the conducting material 106 includes one or more of: Cu, Al, Au, Ag, Co, Graphene, or W. Layer 107 is a lamination layer to protect the structural integrity of the ACI and to facilitate conducting material plating on its surface. In various embodiments, layer 107 is a thermoplastic and/or thermosetting polymer. For example, composite epoxies, liquid crystalline polymers, polyimide, mold film, or ABF (Ajinomoto Build-up Film) can be used for layer 107. Other similar lamination materials can be used. Substrate or dielectric 108 can be any material commonly used in an integrated circuit package. For example, organic or inorganic material can be used for substrate 108. Examples of substrate 108 include FR4 (e.g., epoxy based laminate), bismaleimide-triaxine, polyimide, silicon, etc.

In some embodiments, PTH vias 109 are formed through substrate 108. These PTH vias 109 in this example are filled with substrate material between conductive layers 106c. Conductive layers 106c extend along the y-axis (which is also the width of the cross-section). The PTH vias 109 are coupled together by conductive layers 106d and 106e which are orthogonal (e.g., perpendicular) to conductive layer 106c. Conductive layer 106d is formed in layer 102 while conductive layer 106e is formed in layer 101. The two conductive terminals of the ACI are 106a and 106b. In some embodiments, conducting terminal 106a is for coupling to one or more transistors (e.g., high-side and low-side switches or bridge). In some embodiments, conducting terminal 106b is for coupled to a capacitor (e.g., capacitor for a regulator). In this example, conducting layer 106e, which is orthogonal to the conducting layers 106c, is used to couple to another ACI inductor, in accordance with some embodiments. The arrows in the conducting layers 106 show the direction of currents, according to one example.

One constraint with the ACI of FIGS. 1A-B is that the pitch of the PTHs is limited by manufacturing technology and cannot easily be scaled. Further, as shown in FIG. 1A, the currents flowing in the PTHs are in opposite directions, and cause their magnetic fluxes to cancel as the PTHs are brought closer together. As such, the inductance reduces as well. For IVR applications, as the inductance is reduced substantially below, for example, approximately 1 nH (nano Henry), the ripple current through the inductor increases, and results in large light load losses and loss in efficiency at the target operating points.

In some embodiments, coaxial PTH are used to increase inductance density. In various embodiment, some coaxial PTHs are filled with magnetic material to improve the Q-factor of the inductors. In some embodiments, coaxial PTH vias are plated with conductive material. In other embodiments, the vias have one wall which is not plated.

FIGS. 2A-I illustrate a process flow (200, 220, 230, 240, 250, 260, 270, 280, and 290, respectively) for fabricating coaxial magnetic material based inductors, in accordance with some embodiments.

Cross-section 200 illustrates a substrate 108 (e.g., core of a multi-layer package) with conductive material 106 deposited on is top and bottom surfaces. A person skilled in the art would appreciate that many different mechanisms can be used to deposit conductive layers 106 below and above substrate 108. Cross-section 220 illustrates the case after outer PTH drilling resulting in holes or trenches 221. Any suitable drilling technique can be used for PTH drilling. In this example two holes are formed. However, any number of holes may be drilled according to the number of desired inductors.

Cross-section 230 illustrates the case after PTH wall plating is done. In this case conductive material 106c is deposited along the walls of the hole 221. The conductive material 106c is adjacent to substrate 108 and also connects with top and bottom conductive layers 106. Here, label 109 indicates the resultant wall plated PTH vias.

Cross-section 240 illustrates deposition of high permeability magnetic material 241 to plug the PTH wall plated vias 109 such that magnetic material 241 is adjacent to conductive layers 106c of the PTH wall plated vias 109. In some embodiments, material 241 exhibits magnetic properties and is one of a paramagnet or a ferromagnet, and includes one or more of: Pt, Pd, W, Ce, Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fe_2O_3$, Nd, $Nd_2O_3$, $KO_2$, Pr, Sm, $Sm_2O_3$, Tb, $Tb_2O_3$, Tm, $Tm_2O_3$, V, $V_2O_3$ or epoxy material with particles of a magnetic alloy. A magnetic alloy can be an alloy formed of one or more of: Pt, Pd, W, Ce, Al, Li, Mg, Na, Cr, Co, Dy, Er, Eu, Gd, Fe, Nd, K, Pr, Sm, Tb, Tm, or V. In some embodiments, material 241 exhibit non-insulating but magnetic properties, and wherein the material includes one or more of: Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge.

Cross-section 250 illustrates the deposition of layer 251 which is a lamination material. In various embodiment, layer 251 is deposited on top and bottom surfaces such that layer 251 is adjacent to magnetic material 241, top and bottom edges of PTH vias 106c, and top and bottom conductors 106. In various embodiments, layer 251 facilitates conducting material plating on its surface. In some embodiments, layer 251 is a thermoplastic and/or thermosetting polymer. For example, composite epoxies, liquid crystalline polymers, polyimide, mold film, or ABF (Ajinomoto Build-up Film) can be used for layer 251. Other similar lamination materials can be used.

Cross-section 260 illustrates the case after inner PTH drilling through magnetic material 241 leaving holes 261. The thickness of the magnetic materials 241 is dictated by the size of the hole 261 or drill dimension, in accordance with some embodiments. In various embodiments, the inductance also depends on the thickness of the remaining magnetic material 241 after holes 261 are formed.

Cross-section 270 illustrates the case after walls of PTHs 261 are plated with conducting material 106 such that magnetic material 241 is sandwiched between conducting layers 106. As such, coaxial magnetic PTH is formed indicated by reference sign 209. As shown, the coaxial magnetic PTH 209 includes the inner PTH 109 with non-magnetic material in hole 261 (e.g., same material as 108). In various embodiments, material 106, which is plated in the PTHs 261, is extended along the y-direction to make contact with the top and bottom conducting layers 106 (also referred to as pad plating) shown in cross-sections 270 and 280.

Cross-section 290 illustrates the core structure that couples the pad plating layers 106 to higher metal layers for connection to other devices. In various embodiments, both magnetic inductors and non-magnetic inductors are formed in the same substrate. For example, non-magnetic inductors (e.g., those described with reference to FIGS. 1A-B) are formed in region 281 while coaxial magnetic inductors are formed in region 282.

FIGS. 3A-B illustrate a cross-section 300 and a corresponding 3D view 320, respectively, of a coaxial magnetic material based inductor using PTH vias fabricated with the process flow of FIGS. 2A-I, in accordance with some embodiments. In this example, the co-axial PTH loop inductor is designed on a four-layer (4L) core. In some embodiments, an equivalent of a two turn PTH loop inductor (e.g., also shown in region 282) is fabricated in half the area compared to PTH loop inductor of FIG. 1A. Also, because the current directions through the outer and inner conductors, 306a and 306b, respectively of the coaxial PTH 209 are in the same direction, the magnetic fluxes are positively coupled with very high coupling, increasing the inductance even further, in accordance with some embodiments. In some embodiments, using the process described in FIGS. 2A-I, it is possible to use a high permeability material 241 between the outer and inner conductors 306a and 306b, respectively of the coaxial PTH 209, further increasing inductance density.

FIGS. 4A-G illustrate a process flow (400, 420, 430, 440, 450, and 460, respectively) for fabricating a coaxial magnetic material based inductors with selective PTH wall plating, in accordance with some embodiments. Cross-sections 400 and 420 are same as cross-sections 200 and 220, respectively. Cross-section 430 illustrates the case after magnetic material 241 is filled in the PTH without plating on the sides of holes 221. Cross-section 440 illustrates the case after the deposition of layer 251 which is a lamination material. In various embodiments, layer 251 is deposited on the top and bottom surfaces such that layer 251 is adjacent to magnetic material 241, and the top and bottom conductors 106. In various embodiments, layer 251 facilitates conducting material plating on its surface. In some embodiments, layer 251 is an ABF layer (Ajinomoto Build-up Film). Other similar lamination materials can be used.

Cross-section 450 illustrates the case after another PTH 351 is formed by PTH drilling through magnetic material 351. Cross-section 450 illustrates the case after wall plating of the PTH 351 with conducting material 106. The plated walls extend along the y-direction and are then coupled to another conductor 106 running orthogonal to the plated walls. As such, a partial coaxial magnetic PTH 409 is formed where magnetic material 241 is adjacent to one wall plated conductor instead of two.

Cross-section 460 illustrates the core structure that couples the pad plating layers 106 to higher metal layers for connection to other devices. In various embodiments, both magnetic inductors and non-magnetic inductors are formed in the same substrate. For example, non-magnetic inductors (e.g., those described with reference to FIGS. 1A-B) are formed in region 461 while coaxial magnetic inductors are formed in region 462.

FIGS. 5A-B illustrate a cross-section 500 and a 3D view 520, respectively, of coaxial magnetic material based inductor using PTH vias fabricated using the process flow of FIGS. 4A-G, in accordance with some embodiments. In this example, the co-axial PTH loop inductor is designed on a four-layer (4L) core. In some embodiments, an equivalent of a two turn PTH loop inductor (e.g., also shown in region 462) is fabricated in half the area compared to PTH loop inductor of FIG. 1A. Compared to inductor of FIGS. 3A-B, here the inductance is comparable but the quality factor is nearly twice as high. The high-quality factor may result in reduced fixed losses for integrated voltage regulator applications.

Figure 6:
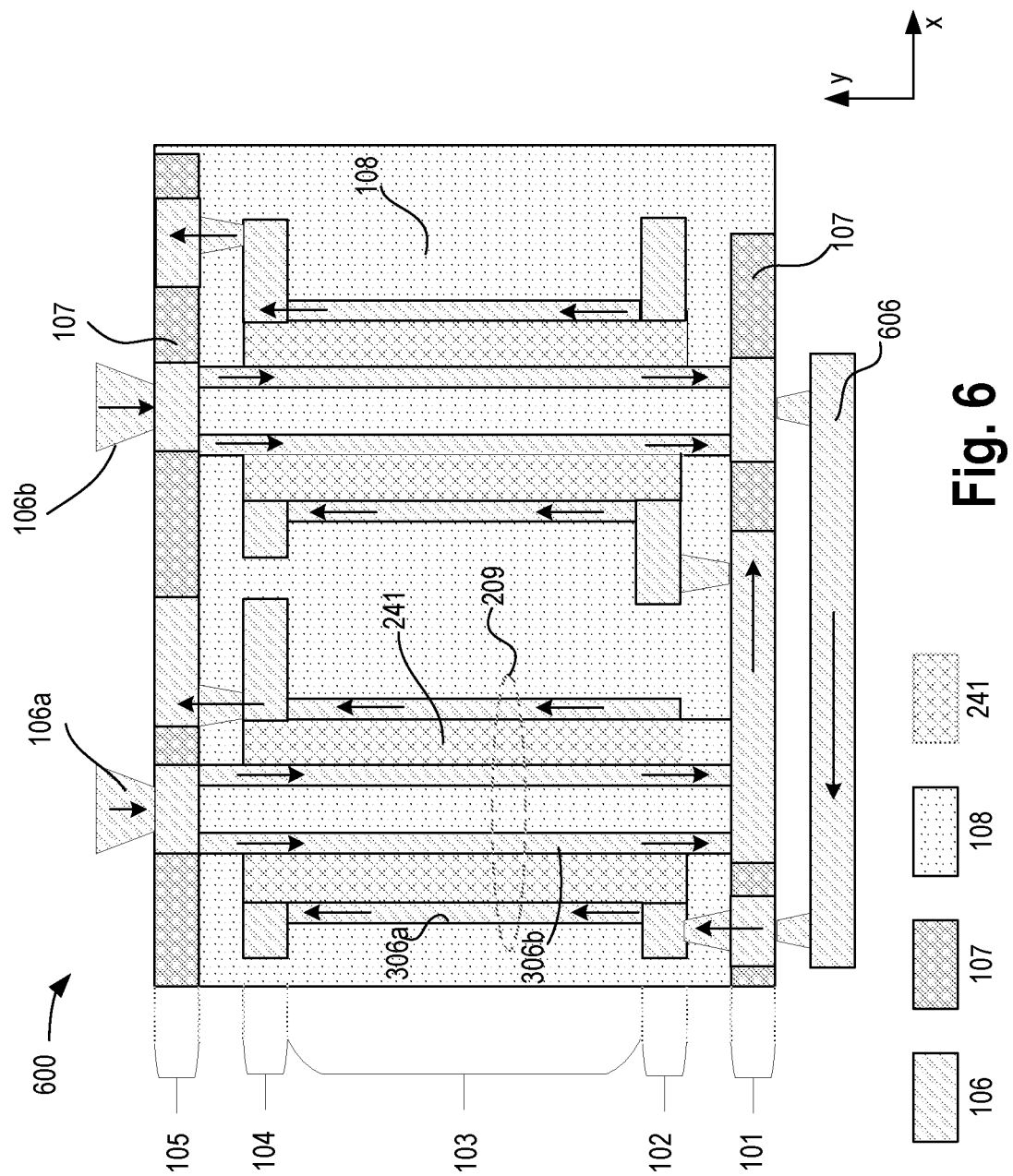
FIG. 6 illustrates a cross-section of a negatively coupled inductor with coaxial PTH, and an inductor with just one coaxial PTH, in accordance with some embodiments.
Figure 7:
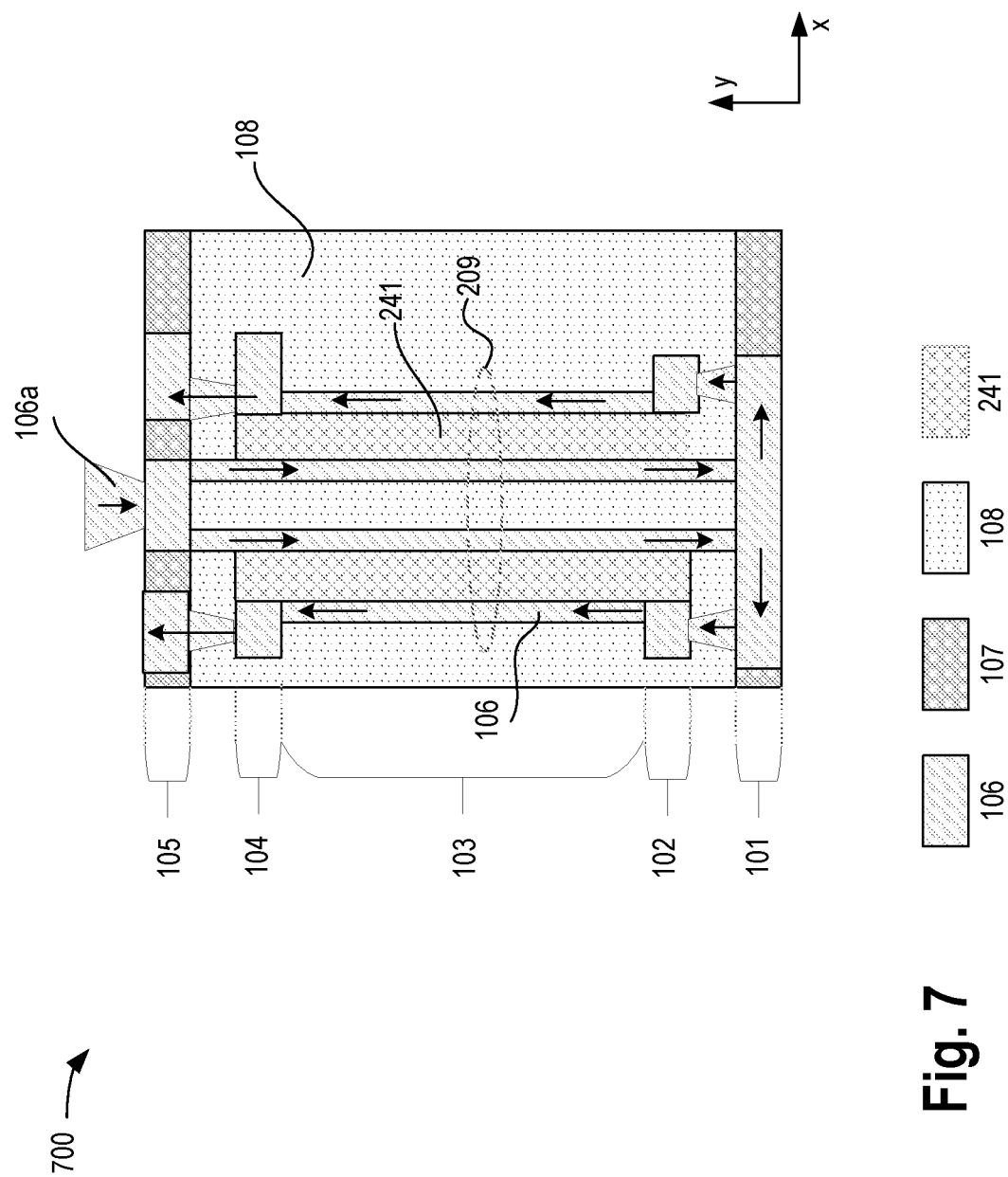
FIG. 7 illustrates a cross-section 700 of an inductor with just one magnetic coaxial PTH, in accordance with some embodiments.

FIG. 6 illustrates a cross-section 600 of a negatively coupled inductor with coaxial PTH, and an inductor with just one coaxial PTH, in accordance with some embodiments. In this example, an additional conductor 606 is provided which couples the two coaxial PTHs 309 to cause the current direction in outer and inner conductors 306a/b to be in opposing directions as indicated by the arrows. As such, negatively coupled coaxial magnetic PTH inductor is formed, in accordance with some embodiments. FIG. 7 illustrates a cross-section 700 of an inductor with just one magnetic coaxial PTH, in accordance with some embodiments.

Figure 8:
FIG. 8 illustrates a table showing improvement in inductance and Q-factor for inductors fabricated according to various embodiments of the disclosure.

FIG. 8 illustrates a table 800 showing improvement in inductance and Q-factor for inductors fabricated according to various embodiments of the disclosure. As can be seen, the coaxial PTH topology of FIGS. 3A-B provides approximately 3× increase in inductance density, with no material changes, and with a moderate reduction in quality factor, when compared to a standard PTH of FIGS. 1A-B. With the inclusion of commercially available high permeability materials ($\mu_r=7$ @ 140 MHz), the inductance density improvements are between 4× and 6×, with some recovery of the quality factor. If the high permeability material is used as the filler material in the coaxial PTH only, the inductance density improves by 4× and there is no impact to high speed IO signaling, for example. To further increase inductance density, the magnetic material can be used as the pre-preg material between the outer and inner layers of the core, resulting in a 6× increase in inductance density. This can have some impact to signaling, which can be minimized by preventing routing over the core. The unplated coaxial PTH of FIGS. 5A-B results in inductance which is comparable to the plated coaxial PTH of FIGS. 3A-B, but with 2× improvement in Q-factor and reduction in DC resistors (Rdc). Overall, both coaxial PTH based inductors are superior to ACIs and can allow for packing more inductors per area than before.

Figure 9:
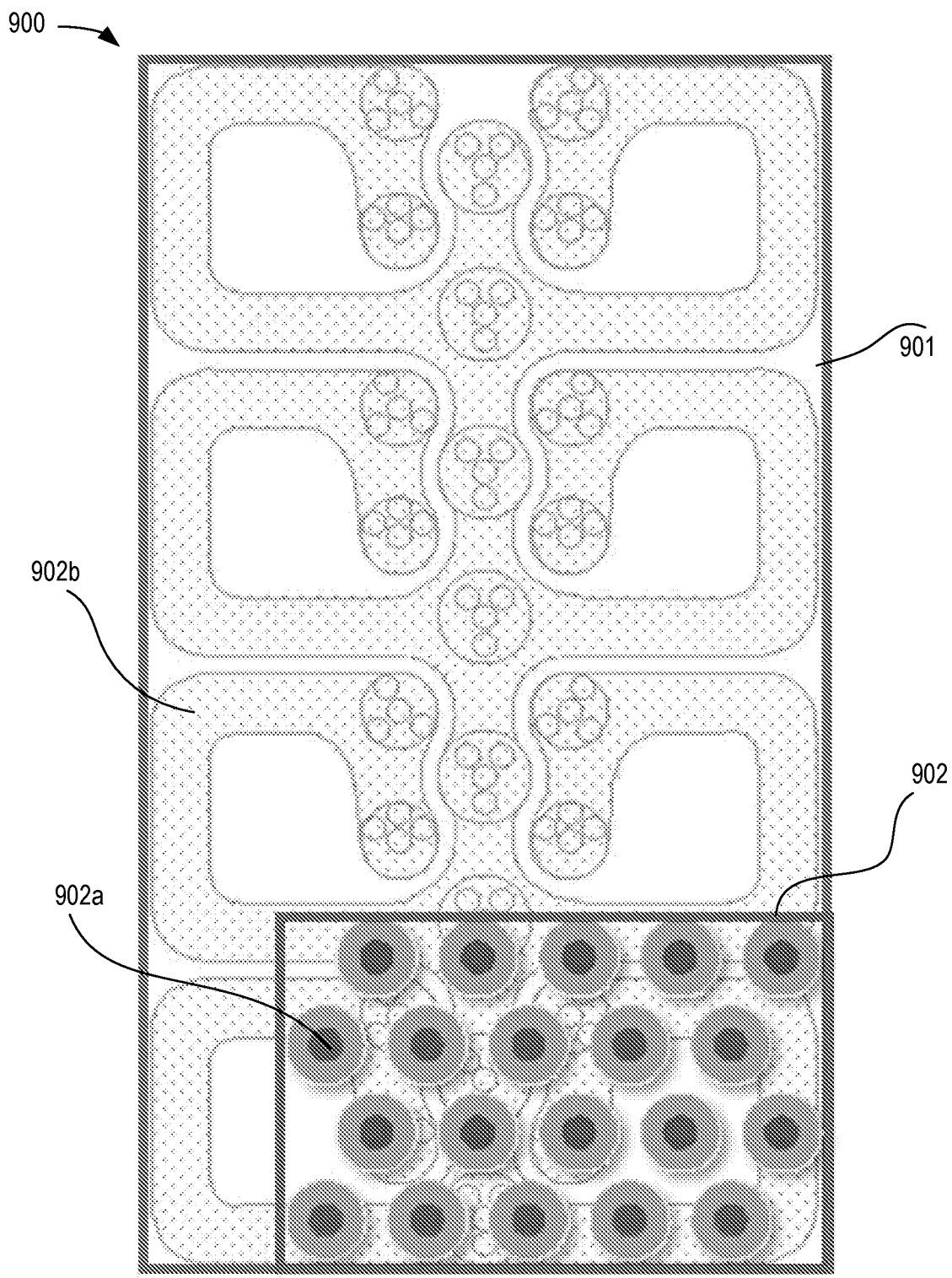
FIG. 9 illustrates a top view of a package with coaxial magnetic material based inductors compared with air core inductors, according to some embodiments.

FIG. 9 illustrates a top view 900 of a package 901 with coaxial magnetic material based inductors compared with air core inductors 902b, according to some embodiments. In various embodiments, coaxial magnetic material based inductor 901a is much smaller than ACI 902b. As such, in this example, 10 coaxial magnetic material based inductors can be packed in area 902 compared to just 8 inductors loops of ACIs 902b. Here, area of 901 is about 4 times the area of 902. In this example, 40 inductors can be fit in the same area as the 8 inductors from area 901. The coaxial magnetic material based inductors allows for implementing high performance and smaller integrated voltage regulators.

Figure 10:
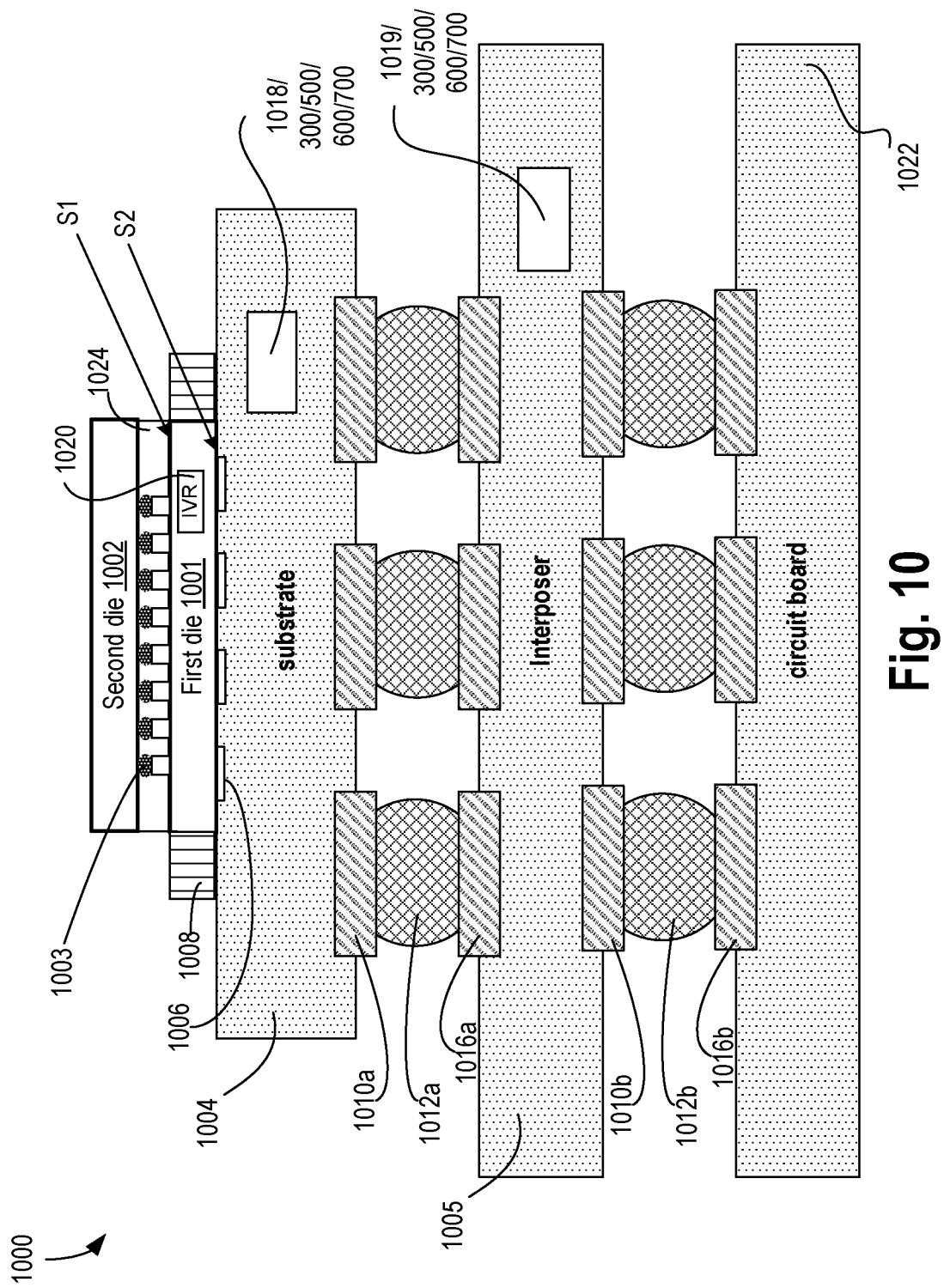
FIG. 10 illustrates a cross-section of package with coaxial magnetic material based inductors, according to some embodiments of the disclosure.

FIG. 10 illustrates a cross-section 1000 of package with coaxial magnetic material based inductors, according to some embodiments of the disclosure. In some embodiments, IC (integrated circuit) package assembly may include first die 1001, package substrate 1004, interposer 1005, and circuit board 1022. IC package assembly of cross-sectional view 1000 is one example of a stacked die configuration in which first die 1001 is coupled to package substrate 1004, and second die 1002 is coupled with first die 1001, in accordance with some embodiments.

In some embodiments, first die 1001 may have a first side S1 and a second side S2 opposite to the first side S1. In some embodiments, the first side S1 may be the side of the die commonly referred to as the "inactive" or "back" side of the die. In some embodiments, the second side S2 may include one or more transistors, and may be the side of the die commonly referred to as the "active" or "front" side of the die. In some embodiments, second side S2 of first die 1001 may include one or more electrical routing features 1006. In some embodiments, second die 1002 may include an "active" or "front" side with one or more electrical routing features 606. In some embodiments, electrical routing features 1006 may be bond pads (e.g., formed from a combination of bumps and solder balls 1003).

In some embodiments, second die 1002 may be coupled to first die 1001 in a front-to-back configuration (e.g., the "front" or "active" side of second die 1002 is coupled to the "back" or "inactive" side S1 of first die 1001). In some embodiments, dies may be coupled with one another in a front-to-front, back-to-back, or side-to-side arrangement. In some embodiments, one or more additional dies may be coupled with first die 1001, second die 1002, and/or with package substrate 1004. Other embodiments may lack second die 1002. In some embodiments, first die 1001 may include one or more TSVs (through-silicon-vias). In some embodiments, second die 1002 is coupled to first die 1001 by die interconnects formed from combination of bumps and solder balls 1003. In some embodiments, solder balls 1003 are formed using a solder-on-die (SOD) process.

In some embodiments, inter-die interconnects may be solder bumps, copper pillars, or other electrically conductive features. In some embodiments, an interface layer 1024 may be provided between first die 1001 and second die 1002. In some embodiments, interface layer 1024 may be, or may include, a layer of under-fill, adhesive, dielectric, or other material. In some embodiments, interface layer 1024 may serve various functions, such as providing mechanical strength, conductivity, heat dissipation, or adhesion.

In some embodiments, first die 1001 and second die 1002 may be single dies (e.g., first die 1001 is a single die instead of multiple dies). In other embodiments, first die 1001 and/or second die 1002 may include two or more dies. For example, in some embodiments first die 1001 and/or second die 1002 may be a wafer (or portion of a wafer) having two or more dies formed on it. In some embodiments, first die 1001 and/or second die 1002 includes two or more dies embedded in an encapsulant. In some embodiments, the two or more dies are arranged side-by-side, vertically stacked, or positioned in any other suitable arrangement. In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

In some embodiments, first die 1001 and/or second die 1002 may be a primary logic die. In some embodiments, first die 1001 and/or second die 1002 may be configured to function as memory, an application specific circuit (ASIC), a processor, or some combination of such functions. For example, first die 1001 may include a processor and second die 1002 may include memory. In some embodiments, one or both of first die 1001 and second die 1002 may be embedded in encapsulant 1008. In some embodiments, encapsulant 1008 can be any suitable material, such as, liquid crystalline polymers, mold film, or ABF (Ajinomoto Build-up Film) substrate, other dielectric/organic materials, resins, epoxies, polymer adhesives, silicones, acrylics, polyimides, cyanate esters, thermoplastics, and/or thermosets.

In some embodiments, first die 1001 may be coupled to package substrate 1004 (e.g., CPU substrate). In some embodiments, package substrate 1004 may be a coreless substrate. For example, package substrate 1004 may be a bumpless build-up layer (BBUL) assembly that includes a plurality of "bumpless" build-up layers. Here, the term "bumpless build-up layers" generally refers to layers of substrate and components embedded therein without the use of solder or other attaching means that may be considered "bumps."

In some embodiments, the one or more build-up layers may have material properties that may be altered and/or optimized for reliability, warpage reduction, etc. In some embodiments, package substrate 1004 may be composed of a polymer, ceramic, glass, or semiconductor material. In some embodiments, package substrate 1004 may be a conventional cored substrate and/or an interposer.

In some embodiments, interposer 1005 is provided between circuit board 1022 and substrate 1004. Interposer 1005 of the various embodiments may be formed of a variety of materials. For example, interposer 1005 may be formed of an epoxy resin, a fiberglass-reinforced epoxy resin, a ceramic material, or a polymer material such as polyimide. In some embodiments, interposer 1005 may be formed of alternate rigid or flexible materials, such as silicon, germanium, and other group III-V and group IV materials of the Periodic Table. In some embodiments, interposer 1005 may include metal interconnects and vias including but not limited to TSVs. In some embodiments, interposer 1005 may include embedded devices including both passive and active devices. Such devices may include, but are not limited to, capacitors, decoupling capacitors, resistors, inductors, fuses, diodes, transformers, sensors, ESD (electrostatic discharge diode) devices, and memory devices. In some embodiments, interposer 1005 may include complex devices such as RF devices, power amplifiers, power management devices, antennas, arrays, sensors, and MEMS devices, etc. In some embodiments, package interconnects 1012*a* may couple electrical routing features 1010*a* disposed on the second side of package substrate 1004 to corresponding electrical routing features 1016*a* on interposer 1005.

In some embodiments, circuit board (or motherboard) 1022 may be a PCB (printed circuit board) composed of an electrically insulating material such as an epoxy laminate. For example, circuit board 1022 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material.

Structures such as traces, trenches, and vias (which are not shown here) may be formed through the electrically insulating layers to route the electrical signals of first die 1001 through the circuit board 1022. Circuit board 1022 may be composed of other suitable materials in other embodiments. In some embodiments, circuit board 1022 may include other electrical devices coupled to the circuit board that are configured to route electrical signals to or from first die 1001 through circuit board 1022. In some embodiments, circuit board 1022 may be a motherboard.

In some embodiments, a one side of interposer 1005 is coupled to the second side of substrate 1004 via routings 1016*a*, 1012*a*, and 1010*a*. In some embodiments, another side of interposer 1005 is coupled to circuit board 1022 by package interconnects 1010*b*, 1012*b*, and 1016*b*.

In some embodiments, package substrate 1004 may have electrical routing features formed therein to route electrical signals between first die 1001 (and/or the second die 1002) and circuit board 1022 and/or other electrical components external to the IC package assembly. In some embodiments, package interconnects 1012a/b and die interconnects 1006 include any of a wide variety of suitable structures and/or materials including, for example, bumps, pillars or balls formed using metals, alloys, solderable material, or their combinations. In some embodiments, electrical routing features 1010 may be arranged in a ball grid array ("BGA") or other configuration.

In some embodiments, voltage regulator 1020 (e.g., an integrated VR) is provided in first die 1001 (or second die 1002) which includes switching elements of the voltage regulator (e.g., high-side and low-side switches or bridges). In some embodiments, the relatively large low-loss switching elements placed in series with the inductors. In some embodiments, coaxial PTH inductors (e.g., unplated coaxial PTH or plated coaxial PTH) are fabricated in substrate 1004 as shown by reference sign 1018 (e.g., 300/500/600/700). In some embodiments, coaxial PTH inductors (e.g., unplated coaxial PTH or plated coaxial PTH) are fabricated in interposer 1005 as shown by reference sign 1018 (e.g., 300/500/600/700).

In some embodiments, a control circuit disposed in the die stack (e.g., first die 1001 or second die 1002) monitors the current demand placed on the voltage regulators 1020 by each power consumer (e.g., by each rail coupled to a processor core). As the load (e.g., the load current demand) presented by the power consumer increases, the control circuit may conductively couple an inductor module (e.g., one or more magnetic inductors) while the high load condition exists. As the load decreases, the control circuit may decouple the one or more inductors from the inductor module, freeing the one or more inductors for use by another power consumer.

In some embodiments, a power delivery system (e.g., for and in first and/or second dies 1001/1002) is provided that includes a plurality of power delivery circuits (e.g., power gates driven by voltage regulators), each of the circuits to supply a load current to a respective one of a plurality of conductively coupled loads (e.g., processor core, cache, graphics unit, memory, etc.); a plurality of magnetic inductor modules (e.g., 1018/1019), each of the plurality of inductor modules having an allowable current threshold, each of the plurality of inductor modules conductively coupled to a respective one of the power delivery circuits; and control circuitry to: receive information indicative of the load current supplied to at least one power delivery circuit; receive information indicative of the allowable current threshold of the at least one power delivery circuit; and determine whether the load current supplied by the at least one power delivery circuit exceeds the allowable current threshold for the inductor module conductively coupled to the at least one power delivery circuit.

Figure 11:
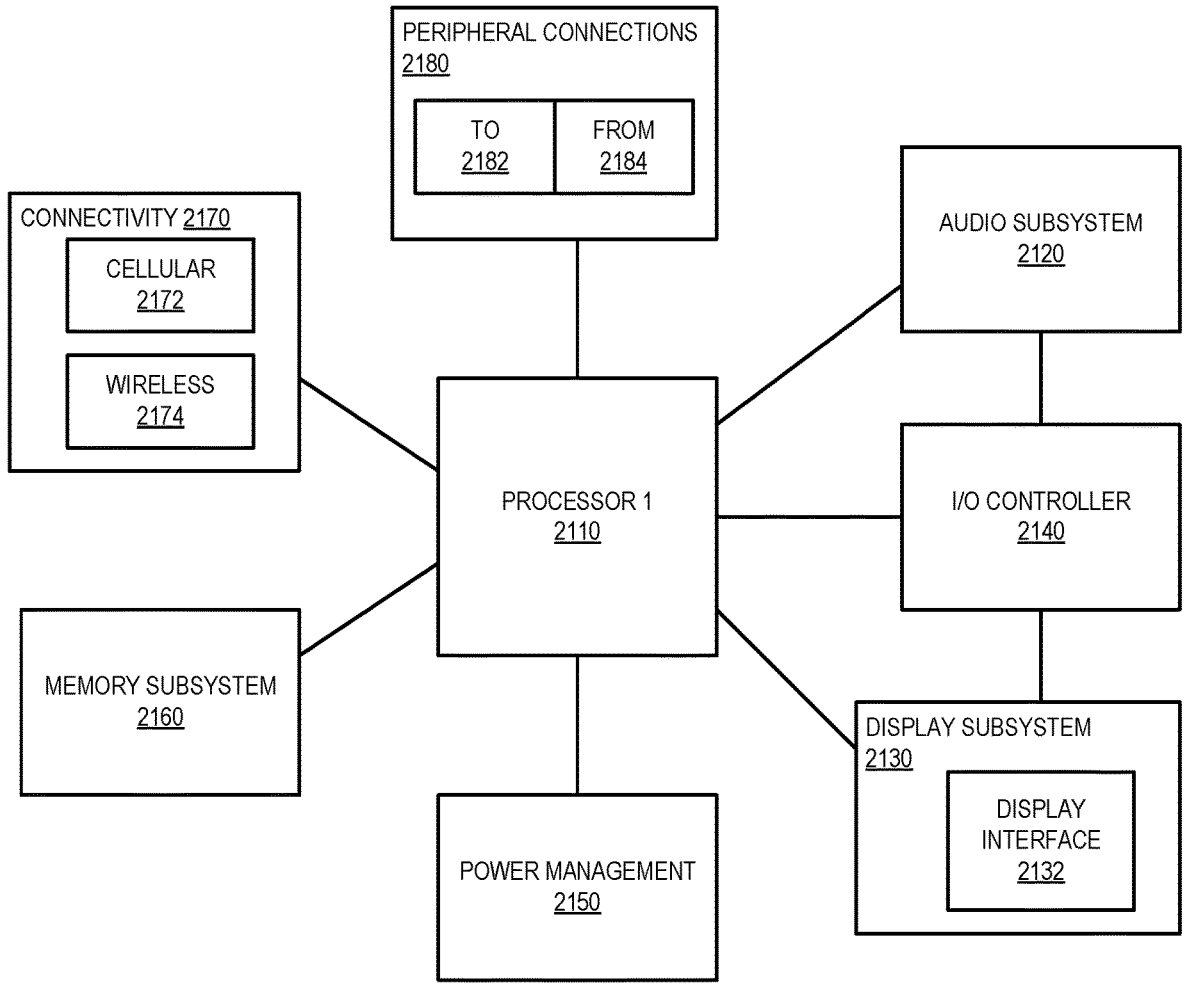
FIG. 11 illustrates a smart device or a computer system or a SoC (System-on-Chip) which includes coaxial magnetic material based inductors, according to some embodiments.

FIG. 11 illustrates a smart device or a computer system or a SoC (System-on-Chip) which includes coaxial magnetic material based inductors, according to some embodiments. In this example, a block diagram of an embodiment of a mobile device is provided in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used without departing from the scope of the disclosure.

In some embodiments, computing device 2100 includes a first processor 2110 (e.g., First die 1001). The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An apparatus comprising: a plurality of plated through holes; a material with magnetic properties adjacent to the plurality of plated through holes; and one or more conductors orthogonal to a length of the plurality of plated through holes, the one or more conductors to couple one plated through hole of the plurality with another plated through hole of the plurality such that an inductor is formed.

Example 2. The apparatus of example 1, wherein the material is surrounded by a conductive material along a length of the material.

Example 3. The apparatus according to any of the preceding examples, wherein the material is adjacent to a conductive material on one side along a length of the material, and wherein another side along the length of the material is adjacent to a dielectric.

Example 4. The apparatus according to any of the preceding examples, wherein the material with magnetic properties is a paramagnet or a ferromagnet and includes one or more of: Pt, Pd, W, Ce, Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fe_2O_3$, Nd, $Nd_2O_3$, $KO_2$, Pr, Sm, $Sm_2O_3$, Tb, $Tb_2O_3$, Tm, $Tm_2O_3$, V, $V_2O_3$, or epoxy material with particles of a magnetic alloy.

Example 5. The apparatus of example 1, wherein the material is to exhibit non-insulating properties, and wherein the material includes one or more of: Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, $Cu_2MnA$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge.

Example 6. The apparatus according to any of the preceding examples, wherein the one or more conductors comprise a material which includes one or more of: Cu, Ag, Al, Au, Co, Graphene, or W.

Example 7. The apparatus according to any of the preceding examples, wherein the inductor is coupled to a high-side bridge and a low-side bridge.

Example 8. The apparatus o according to any of the preceding examples, wherein the inductor is coupled to a capacitor.

Example 9. The apparatus according to any of the preceding examples, wherein the inductor is coupled to a processor core.

Example 10. A package comprising: a first die; a second die coupled to the first die; a substrate coupled to the first die, wherein the substrate comprises: a plurality of layers of conductive material and dielectric, wherein at least one of the layers of the plurality is adjacent to the substrate, wherein a region of the plurality of layers includes: a plurality of plated through holes; a material with magnetic properties adjacent to the plurality of plated through holes; and one or more conductors orthogonal to a length of the plurality of plated through holes, the one or more conductors to couple one plated through hole of the plurality with another plated through hole of the plurality such that an inductor is formed.

Example 11. The package of example 10 comprises an interposer adjacent to at least one of the layers of the plurality of layers.

Example 12. The package of example 11, wherein the interposer comprises a reflow grid array (RGA).

Example 13. The package according to any one of examples 10 to 12, wherein the material is surrounded by a conductive material along a length of the material.

Example 14. The package according to any one of examples 10 to 13, wherein the material is adjacent to a conductive material on one side along a length of the material, and wherein another side along the length of the material is adjacent to a dielectric.

Example 15. The package according to any one of examples 10 to 14, wherein the material with magnetic properties is a paramagnet or a ferromagnet and includes one or more of: Pt, Pd, W, Ce, Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fe_2O_3$, Nd, $Nd_2O_3$, $K_2$, Pr, Sm, $Sm_2O_3$, Tb, $Tb_2O_3$, Tm, $Tm_2O_3$, V, $V_2O_3$, or epoxy material with particles of a magnetic alloy.

Example 16. The package of example 10, wherein the material is to exhibit non-insulating properties, and wherein the material includes one or more of: Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge.

Example 17. The package according to any one of examples 10 to 16, wherein the one or more conductors comprise a material which includes one or more of: Cu, Ag, Al, Au, Co, Graphene, or W.

Example 18. The package according to any one of examples 10 to 17, wherein the inductor is coupled to a high-side bridge and a low-side bridge of the first die.

Example 19. The package according to any one of examples 10 to 18, wherein the inductor is coupled to a capacitor adjacent to the first die.

Example 20. The package according to any one of examples 10 to 19, wherein the inductor is coupled to the first die.

Example 21. A system comprising: a first die; a second die coupled to the first die; a substrate coupled to the first die, wherein the substrate comprises an apparatus according to any one of examples 1 to 9; an interposer coupled to the substrate; and a printed circuit board coupled to the interposer.

Example 22. A method comprising: drilling through a substrate to create at least two holes, the substrate having a upper surface and a lower surface opposite to the upper surface, wherein the upper and lower surfaces are adjacent to first conductive layers, respectively; filling the at least two holes with a material having magnetic properties; laminating the upper and lower surfaces of the substrate; drilling through a portion of the filled at least two holes; and forming second layers along a length of the filled at least two holes after the drilling, wherein the first and second conductive layers are orthogonal to one another.

Example 23. The method of example 22, wherein the material with magnetic properties is a paramagnet or a ferromagnet and includes one or more of: Pt, Pd, W, Ce, Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fe_2O_3$, Nd, $Nd_2O_3$, $K_2$, Pr, Sm, $Sm_2O_3$, Tb, $Tb_2O_3$, Tm, $Tm_2O_3$, V, $V_2O_3$, or or epoxy material with particles of a magnetic alloy.

Example 24. The method of example 22, wherein the material is to exhibit non-insulating properties, and wherein the material includes one or more of: Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge.

Example 25. The method of example 22, wherein the first and second conductive layers comprise a material which includes one or more of: Cu, Ag, Al, Au, Co, Graphene, or W.

Example 26. A method comprising: forming a plurality of plated through holes; forming a material with magnetic properties adjacent to the plurality of plated through holes; and forming one or more conductors orthogonal to a length of the plurality of plated through holes, the one or more conductors to couple one plated through hole of the plurality with another plated through hole of the plurality such that an inductor is formed.

Example 27. The method of example 26, wherein forming the material comprises surrounding the material by a conductive material along a length of the material.

Example 28. The method according to any one of examples 26 to 27, wherein forming the material depositing the material adjacent to a conductive material on one side along a length of the material, and wherein another side along the length of the material is adjacent to a dielectric.

Example 29. The method according to any one of examples 26 to 28, wherein the material with magnetic properties is a paramagnet or a ferromagnet and includes one or more of: Pt, Pd, W, Ce, Al, Li, Mg, Na, $Cr_2O_3$, CoO, Dy, $Dy_2O$, Er, $Er_2O_3$, Eu, $Eu_2O_3$, Gd, $Gd_2O_3$, FeO, $Fe_2O_3$, Nd, $Nd_2O_3$, $KO_2$, Pr, Sm, $Sm_2O_3$, Tb, $Tb_2O_3$, Tm, $Tm_2O_3$, V, $V_2O_3$, or epoxy material with particles of a magnetic alloy.

Example 30. The method according to any one of examples 26 to 29, wherein the material is to exhibit non-insulating properties, and wherein the material includes one or more of: Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, V, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge.

Example 31. The method according to any one of examples 26 to 29, wherein forming the one or more conductors comprise forming a material which includes one or more of: Cu, Ag, Al, Au, Co, Graphene, or W.

Example 32. The method according to any one of examples 26 to 31 comprises coupling the inductor to a high-side bridge and a low-side bridge.

Example 33. The method according to any one of examples 26 to 32 comprises coupling the inductor to a capacitor.

Example 34. The method according to any one of examples 26 to 33 comprises coupling the inductor to a processor core.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a plurality of plated through holes;
a magnetic material within the plurality of plated through holes, wherein the magnetic material is paramagnetic, ferromagnetic, or a Heusler alloy; and
one or more conductors orthogonal to a length of the plurality of plated through holes, the one or more conductors to couple one plated through hole of the plurality with another plated through hole of the plurality such that an inductor is formed.

2. The apparatus of claim 1, wherein the magnetic material is surrounded by a conductive material along a length of the magnetic material.

3. The apparatus of claim 1, wherein the magnetic material is adjacent to a conductive material on one side along a length of the magnetic material, and wherein another side along the length of the magnetic material is adjacent to a dielectric.

4. The apparatus of claim 1, wherein the magnetic material-includes one or more of: Pt, Pd, W, Ce, Al, Li, Mg, Ma, Cr, Co, Dy, Er, Ey, Gd, Fe, Nd, K, Pr, Sm, Tb, Tm, V, or epoxy material with particles of a magnetic alloy.

5. The apparatus of claim 1, wherein the magnetic material is a Heusler alloy, and wherein the Heusler alloy is a material which includes one or more of: Cu, Mn, Al, In, Sn, Ni, Sb, Ga, Co, Fe, Si, Pd, Sb, V, or Ru.

6. The apparatus of claim 1, wherein the one or more conductors comprise a material which includes one or more of: Cu, Ag, Al, Au, Co, Graphene, or W.

7. The apparatus of claim 1, wherein the inductor is coupled to a high-side bridge and a low-side bridge.

8. The apparatus of claim 1, wherein the inductor is coupled to a capacitor.

9. The apparatus of claim 1, wherein the inductor is coupled to a processor core.

10. A package comprising:
a first die;
a second die coupled to the first die; and
a substrate coupled to the first die, wherein the substrate comprises a plurality of layers of conductive material and dielectric, wherein at least one of the layers of the plurality is adjacent to the substrate, wherein a region of the plurality of layers includes:
a plurality of plated through holes;
a magnetic material within the plurality of plated through holes, wherein the magnetic material is paramagnetic, ferromagnetic, or a Heusler alloy; and one or more conductors orthogonal to a length of the plurality of plated through holes, the one or more conductors to couple one plated through hole of the plurality with another plated through hole of the plurality such that an inductor is formed.

11. The package of claim 10, further comprising an interposer adjacent to at least one of the layers of the plurality of layers.

12. The package of claim 11, wherein the interposer comprises a reflow grid array (RGA).

13. The package of claim 10, wherein the magnetic material is surrounded by a conductive material along a length of the magnetic material.

14. The package of claim 10, wherein the magnetic material is adjacent to a conductive material on one side along a length of the magnetic material, and wherein another side along the length of the magnetic material is adjacent to a dielectric.

15. The package of claim 10, wherein the magnetic material one or more of: Pt, Pd, W, Ce, Al, Li, Mg, Ma, Cr, Co, Dy, Er, Ey, Gd, Fe, Nd, K, Pr, Sm, Tb, Tm, V, or epoxy material with particles of a magnetic alloy.

16. The package of claim 10, wherein the magnetic material is a Heusler alloy, and wherein the Heusler alloy includes one or more of: Cu, Mn, Al, In, Sn, Ni, Sb, Ga, Co, Fe, Si, Pd, Sb, V, or Ru.

17. The package of claim 10, wherein the one or more conductors comprise a material which includes one or more of: Cu, Ag, Al, Au, Co, Graphene, or W.

18. The package of claim 10, wherein the inductor is coupled to a high-side bridge and a low-side bridge of the first die.

19. The package of claim 10, wherein the inductor is coupled to a capacitor adjacent to the first die.

20. The package of claim 10, wherein the inductor is coupled to the first die.

21. A system comprising the package of claim 11, and a printed circuit board coupled to the interposer.

22. The system of claim 21, wherein the magnetic material is surrounded by a conductive material along a length of the magnetic material.

23. The system of claim 21, wherein the magnetic material is adjacent to a conductive material on one side along a length of the magnetic material, and wherein another side along the length of the magnetic material is adjacent to a dielectric.

* * * * *